United States Patent
Moon et al.

(10) Patent No.: US 12,324,273 B2
(45) Date of Patent: Jun. 3, 2025

(54) SEGMENTED AND QUANTUM MECHANICALLY ISOLATED ACTIVE REGIONS IN LIGHT EMITTING DIODES

(71) Applicant: Meta Platforms Technologies, LLC, Menlo Park, CA (US)

(72) Inventors: Yong Tae Moon, Cork (IE); Alexander Tonkikh, Wenzenbach (DE); Christophe Antoine Hurni, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 494 days.

(21) Appl. No.: 17/742,002

(22) Filed: May 11, 2022

(65) Prior Publication Data
US 2023/0268459 A1    Aug. 24, 2023

Related U.S. Application Data

(60) Provisional application No. 63/268,247, filed on Feb. 18, 2022.

(51) Int. Cl.
*H10H 20/81*    (2025.01)
*H10H 20/01*    (2025.01)
(Continued)

(52) U.S. Cl.
CPC .......... *H10H 20/812* (2025.01); *H10H 20/01* (2025.01); *B82Y 20/00* (2013.01); *H01L 25/0753* (2013.01)

(58) Field of Classification Search
CPC .... H10H 20/812; H10H 20/01; H10H 20/821; H10H 20/819; H10H 20/813; B82Y 20/00; H01L 25/0753
See application file for complete search history.

(56) References Cited

U.S. PATENT DOCUMENTS 8,847,249 B2 *   9/2014  Raring .............. H10H 20/813
                                                      257/89
2014/0131732 A1 * 5/2014  Fu ..................... H10H 20/815
                                                      428/166
(Continued)

FOREIGN PATENT DOCUMENTS

EP          3413350 A1    12/2018

OTHER PUBLICATIONS

Yoo Y., et al., "Electrically Driven, Highly Efficient Three-Dimensional GaN-Based Light Emittting Diodes Fabricated by Self-Aligned Twofold Epitaxial Lateral Overgrowth," Scientific Reports, Aug. 29, 2017, Article No. 9633, pp. 1-8.
(Continued)

Primary Examiner — S M Sohel Imtiaz
(74) Attorney, Agent, or Firm — Greenberg Traurig, LLP

(57) ABSTRACT

LED devices and corresponding techniques for manufacturing LED devices are described. In some embodiments, an LED device includes a plurality of mesas, each mesa corresponding to a separate LED and including a layered semiconductor structure. The layered semiconductor structure includes an active region and a quantum barrier (QB) layer. The active region has a matrix of quantum well (QW) cells that are quantum mechanically isolated by the QB layer. In particular, the QB layer can include ridge-shaped structures that laterally separate adjacent QW cells. The matrix of QW cells can be arranged as a two-dimensional array. In some embodiments, the QW cells are epitaxially grown such that each QW cell is thicker along a central region and thinner along a peripheral region, with the peripheral region corresponding to where the QW cell meets a ridge-shaped structure of the QB layer.

12 Claims, 15 Drawing Sheets

(51) Int. Cl.
*H10H 20/812* (2025.01)
*B82Y 20/00* (2011.01)
*H01L 25/075* (2006.01)

(56) References Cited

U.S. PATENT DOCUMENTS

2014/0166974 A1* 6/2014 Yoo .................. H10H 20/813
                                                    257/13
2014/0286369 A1* 9/2014 Katz ................. H10H 20/821
                                                    372/45.012
2021/0024356 A1* 1/2021 Cheng ............... H10H 20/812
2021/0217777 A1* 7/2021 Chung .............. H05B 33/28
2021/0367099 A1* 11/2021 Leung ............. H10H 20/8162

OTHER PUBLICATIONS

International Search Report and Written Opinion for International Application No. PCT/US2023/013238, mailed Jun. 2, 2023, 7 pages.

* cited by examiner

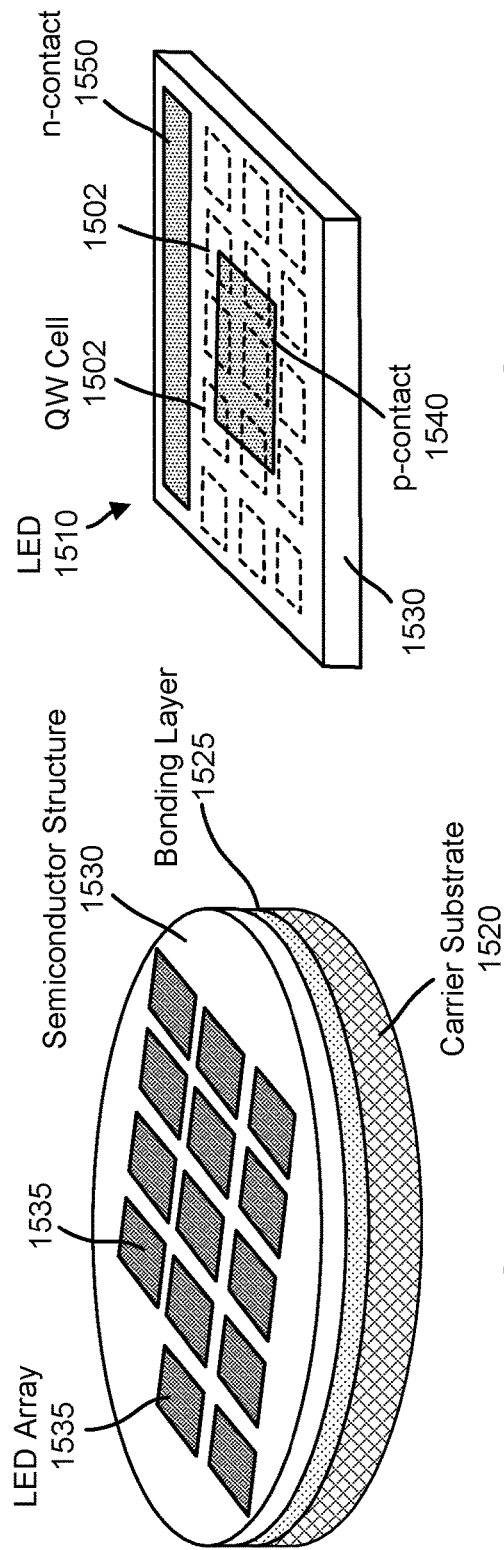
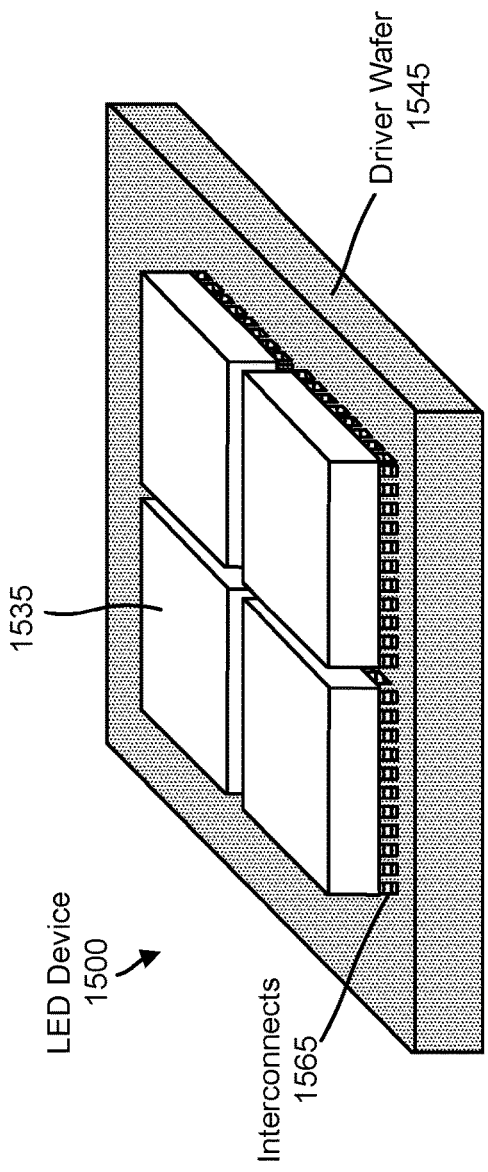
FIG. 15A
FIG. 15B
FIG. 15C

SEGMENTED AND QUANTUM MECHANICALLY ISOLATED ACTIVE REGIONS IN LIGHT EMITTING DIODES

CROSS-REFERENCE TO RELATED APPLICATIONS

This application claims the benefit of U.S. Provisional Application No. 63/268,247, filed Feb. 18, 2022, entitled "QUANTUM NANO MATRIX LED," which is incorporated herein by reference in its entirety.

BACKGROUND

Aspects of the disclosure relate to the design of light emitting diodes (LEDs), e.g., micro-LEDs. As the physical size of LEDs is reduced, efficiency losses due to surface recombination become ever more significant as a factor impacting overall performance. In particular, non-radiative recombination of charge carriers at and/or near the sidewalls of an LED mesa is a major contributor to reduced internal quantum efficiency (IQE) and reduced external quantum efficiency (EQE). In non-radiative recombination, charge carriers recombine to release phonons (heat) instead of photons. Non-radiative recombination can occur as a result of defects along the mesa sidewalls, such as dangling bonds created as a result of etching mesas from a layered epitaxial structure. Non-radiative recombination is a challenging problem for micro-LEDs because such LEDs tend to have a high surface to volume ratio, between the surface area of the mesa sidewalls and the volume of the micro-LED.

SUMMARY

The present disclosure relates to LED devices and methods of fabricating LED devices. In certain aspects, forming an LED may involve shaping a semiconductor structure into a mesa. The semiconductor structure may include a stack of epitaxial layers comprising oppositely doped (p-type and n-type) semiconductor layers and light emitting layers. Embodiments described herein are applicable to mesas of different shapes including, for example, vertical mesas and parabolic mesas. Multiple mesas can be formed concurrently, through etching and other semiconductor processing techniques, to form an LED array for use in an LED display. In general, the light emitting region of an LED is an active region that includes at least one quantum well (QW). Charge carriers (electrons and holes) may be confined and recombine in the QW(s) to release energy in the form of photons, i.e., light.

In certain aspects, non-radiative recombination is reduced through dividing an active region of an LED into a matrix (e.g., a two-dimensional array) of QW structures. Each QW structure is a three-dimensional structure that includes at least one QW. A QW structure can include multiple quantum wells (MQWs). The QW structures are quantum mechanically isolated from each other, in large part due to nanostructures (e.g., ridges) formed in a quantum barrier (QB) layer. In some embodiments, the QB layer corresponds to the first or the last QB layer in a stack of epitaxial layers corresponding to a mesa. The QB layer surrounds each QW structure and may enclose the perimeter of the QW structure such that a surface of the QW structure is surrounded in three dimensions by the QB layer. For example, the nanostructures of the QB layer may be located between adjacent QW structures to laterally separate the adjacent QW structures and reduce or prevent migration (e.g., lateral diffusion) of carriers across the barrier provided by the QB layer. Consequently, migration of carriers to the etched mesa sidewall regions, where the defect density and thus non-radiative recombination may be high, can be reduced or prevented. Thus, the QB layer can operate to reduce non-radiative recombination that may lead to high leakage and low quantum efficiency.

Additionally, the separation between QW structures may reduce plasmonic absorption that would otherwise occur as a result of placing a single, continuous active region in proximity to the mesa sidewalls, since the sidewalls are often coated with metal, e.g., a reflective layer. Improved light extraction is therefore another potential benefit to dividing the active region into a matrix of QW structures that are quantum mechanically isolated from each other.

In some embodiments, the QB layer may extend continuously across the matrix, e.g., to the edges of the active region. For example, the matrix may be organized as a two-dimensional array of QW cells, where each cell is a three-dimensional QW structure having at least one QW, and the QB layer may extend across both dimensions of the array to cover cell surfaces that face a doped semiconductor layer. In some instances, the QB layer may provide a flat surface for growing the doped semiconductor layer.

Various techniques are disclosed herein for creating a matrix of QW structures in conjunction with a QB layer that provides quantum mechanical isolation. In some embodiments, a template is etched to form ridges (or grooves, depending on orientation). The template can be a bare substrate or a substrate with additional layers grown on top of it, e.g., an n-type layer or an MQWs layer grown on top of an n-type layer. QW structures can be formed through epitaxial regrowth on nanostructures (e.g., ridges or grooves) that are located on the template. Alternatively, if the template already includes quantum wells, the QW structures can be formed as part of etching the template. For example, an MQWs layer of a template can be etched to form grooves that define the areas between adjacent MQW cells. The nanostructures of a QB layer can be formed by epitaxially growing the QB layer over the QW structures such that portions of the QB layer conform to the ridges or grooves that have been etched into the template. Similarly, in some embodiments, the QB layer may be grown onto the template before growing the QW structures over the QB layer. In either case, the resulting nanostructures of the QB layer may project into the areas between the QW cells to provide lateral separation and quantum mechanical isolation.

Example No. 1—In certain aspects, an LED device includes a plurality of mesas. Each mesa corresponds to a separate LED in the LED device and includes a semiconductor structure. The semiconductor structure for a mesa can include, among other things, an active region and a first QB layer. The active region includes a two-dimensional (2D) array of QW cells. Each QW cell in the 2D array includes at least one quantum well configured to operate as a light-emitting region. In some embodiments, one or more QW cells in the 2D array are MQW cells, which have multiple quantum wells. The first QB layer operates to quantum mechanically isolate the QW cells in the 2D array from each other. The first QB layer can be continuous across both dimensions of the 2D array. In certain aspects, the LED device of example no. 1 further includes a second QB layer formed on a surface of the active region opposite the first QB layer.

In certain aspects, a QW cell in the 2D array of example no. 1 is an MQW cell that includes a first QW layer, a second QW layer, and a local QB layer between the first QW layer and the second QW layer. Optionally, the first QB layer can be formed to be thicker than the local QB layer.

In certain aspects, the LED device of example no. 1 further includes a p-contact and an n-contact, both of which are shared by the QW cells in a first mesa of the plurality of mesas. The sharing of the p-contact and the n-contact permit charge carriers to be injected into the QW cells in the first mesa as a result of applying a voltage across the p-contact and the n-contact.

In certain aspects, the first QB layer of example no. 1 includes ridge-shape structures that separate adjacent QW cells in the 2D array. In some embodiments, the ridge-shaped structures are sized as nanostructures.

In certain aspects, the 2D array of example no. 1 is epitaxially grown over the first QB layer. Alternatively, the first QB layer may be epitaxially grown over the 2D array. Irrespective of the order in which the 2D array and the first QB layer are grown, the ridge-shaped structures of the first QB layer (e.g., nano-sized ridges) may enclose a perimeter of each QW cell in the 2D array. In this manner, the ridge-shaped structures can form tapered walls along the boundaries of the QW cells.

In certain aspects, the QW cells in the 2D array of example no. 1 each include a central region and a peripheral region. The peripheral region is adjacent to a ridge-shaped structure of the first QB layer and is thinner than the central region. Additionally, a bandgap of a quantum well in the QW cell can be wider along the peripheral region than along the central region.

In certain aspects, the mesas of the LED device in example no. 1 further include a doped semiconductor layer formed on a surface of the first QB layer. The surface of the first QB layer on which the doped semiconductor layer is formed can be a substantially planar surface opposite to the active region. The first QB layer may include a material having a bandgap that differs from a bandgap of the doped semiconductor region and that is wider than a bandgap of a quantum well.

Example No. 2—In certain aspects, a method for forming an LED device involves forming a semiconductor structure comprising an active region and a first QB layer. The active region includes a 2D array of QW cells. Each QW cell in the 2D array includes at least one quantum well configured to operate as a light-emitting region. In some embodiments, one or more QW cells in the 2D array are MQW cells, which have multiple quantum wells. The first QB layer operates to quantum mechanically isolate the QW cells in the 2D array from each other. The first QB layer can be continuous across both dimensions of the 2D array. The forming of the semiconductor structure may involve various processing steps, including epitaxial growth, etching, and epitaxial regrowth. The method further involves etching the semiconductor structure into one or more mesas. Each mesa corresponds to a separate LED and includes sidewalls around QW cells in the 2D array. For example, a single mesa can be formed around the entire 2D array. Alternatively, the 2D array can be partitioned into sub-arrays with a separate mesa around each sub-array.

In certain aspects, the method of example no. 2 further involves forming a p-contact and an n-contact, where the p-contact and the n-contact are shared by the QW cells of the 2D array such that application of a voltage across the p-contact and the n-contact causes charge carriers to be injected into the QW cells of the 2D array concurrently.

In certain aspects, the method of example no. 2 further involves forming the semiconductor structure through etching a template containing at least a substrate into a three-dimensional (3D) shape. The 3D shape includes flat portions and sloped portions, with the sloped portions corresponding to the locations of ridge-shaped structures (e.g., nanostructures) in the first QB layer. The ridge-shaped structures separate adjacent QW cells in the 2D array. The 2D array can be formed as part of etching the template or epitaxially grown after the template has been etched.

In certain aspects, the method of example no. 2 further involves epitaxially growing the 2D array after the template has been etched into the 3D shape. When the QW cells are grown onto the etched template, the resulting QW cells may be thinner along the sloped portions than the flat portions due to a density of injected adatoms being lower in the sloped portions. Additionally or alternatively, the QW cells may have a wider bandgap along the sloped portions than the flat portions due to the sloped portions having a different proportion of quantum well material.

In certain aspects, the method of example no. 2 further involves epitaxially growing the 2D array over the first QB layer or, alternatively, epitaxially growing the first QB layer over the 2D array.

In certain aspects, the method of example no. 2 further involves forming the 2D array through etching the template into the 3D shape, where the template includes, in addition to the substrate, a doped semiconductor layer and one or more quantum well layers. For example, the template can include multiple quantum well layers and at least one local QB layer between each pair of adjacent quantum well layers. The quantum well layers and the local QB layers can collectively form an active region that will be segmented into individual QW cells as part of etching the template.

In certain aspects, the method of example no. 2 further involves planarizing the first QB layer to form a planar surface opposite the active region, then forming a doped semiconductor layer on the planar surface.

BRIEF DESCRIPTION OF THE DRAWINGS

Aspects of the disclosure are illustrated by way of example.

FIGS. 15A-15C illustrate an example of a process for forming an LED device, according to certain embodiments.

Figure 1:
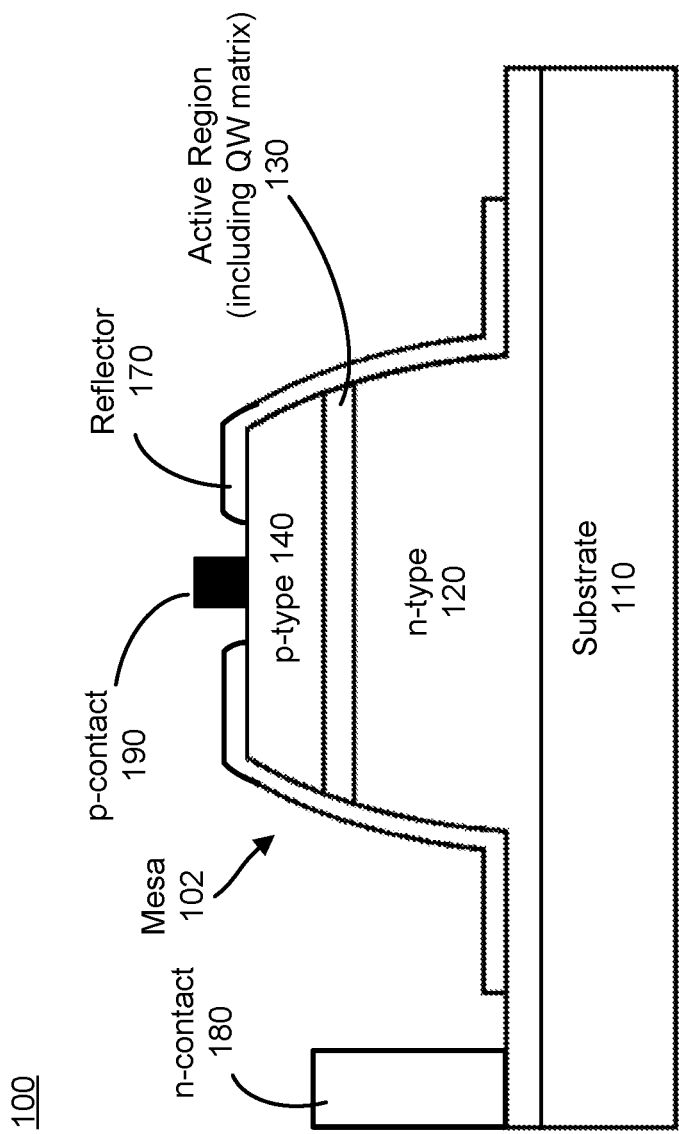
FIG. 1 illustrates an example of an LED, according to some embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label with a second label (e.g., an alphabetical label) that distinguishes among the similar components. If only the first reference label is used in the specification, the description is applicable to any one of the similar components having the same first reference label irrespective of the second reference label.

DETAILED DESCRIPTION

The present disclosure relates to LED devices and methods of fabricating LED devices. An LED device may include one more LEDs, where each LED has a mesa shape formed, for example, through dry or wet etching a semiconductor structure. The active (light-emitting) region within an individual LED may include one or more quantum well (QW) layers. In certain aspects, the active region is segmented to form a matrix (e.g., a two-dimensional array) of QW structures. Each QW structure corresponds to an individual light-emitting region that includes at least one QW layer. In some embodiments, LEDs are formed at a microscopic scale, e.g., as micro-LEDs with a width of 100 micrometers or less. Accordingly, the QW structures within a micro-LED may be nanoscale light emission regions that collectively contribute to the light output of the micro-LED. The matrix of QW structures can be driven through a shared contact, e.g., a shared p-contact and/or a shared n-contact, using a driver circuit. For example, in some embodiments, an LED device includes a one-dimensional or two-dimensional array of LEDs formed on a first wafer that is bonded to a second wafer containing driver circuits. Each LED in the array of LEDs can be mesa shaped and can include a segmented active region characterized by a matrix of QW structures.

Aspects of the present disclosure are also directed to techniques for quantum mechanically isolating QW structures from each other to prevent or reduce migration of charge carriers between adjacent QW structures, e.g., migration from QW structures near the center of the active region toward QW structures near the edges of the active region. In this manner, non-radiative recombination of charge carriers at and/or near the sidewalls of an LED mesa can be minimized. Further, in certain aspects, semiconductor processing to form a matrix of QW structures may be performed as part of defining the overall layered structure of an LED and independently of processing to define the mesa shape of the LED. For example, one or more QW matrices may be formed on a semiconductor structure before etching the semiconductor structure into a plurality of mesas. The mesa etch may define the overall shape of each LED while allocating an array of QW cells to each LED, e.g., through partitioning a QW matrix into a plurality of sub-matrices. Because the QW structures are quantum mechanically isolated, the contribution of any surface imperfections created during the mesa etch to non-radiative recombination can be significantly reduced.

FIG. 1 illustrates an example of an LED 100, according to some embodiments. The LED 100 includes a mesa 102 formed from a semiconductor structure. The semiconductor structure can include multiple layers of semiconductor materials, such as a semiconductor layer 120, a semiconductor layer 140, and one or more layers that form an active region 130. The active region 130 may be configured to emit incoherent light and, as shown in FIG. 1, can include a matrix of QW structures (also referred to herein as a quantum well matrix or "QW matrix"). Further, LED 100 may be a micro-LED having a lateral dimension, or diameter, of less than 100 micrometers (e.g., under 10 micrometers). The semiconductor structure of the LED 100 may be made of inorganic materials. For example, the semiconductor structure may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb).

The semiconductor structure of the LED 100 may be manufactured by growing multiple epitaxial layers on a substrate, in one or more chambers, using techniques such as molecular beam epitaxy (MBE), metalorganic vapor-phase epitaxy (MOVPE), also known as organometallic vapor-phase epitaxy (OMVPE) or metalorganic chemical vapor deposition (MOCVD), or physical vapor deposition (PVD), such as pulsed laser deposition (PLD). For example, the semiconductor layers may be grown layer-by-layer on a substrate with a certain crystal lattice orientation, such as a sapphire, quartz, gallium nitride (GaN), gallium arsenide (GaAs), gallium phosphide (GaP). The silicon substrate may be cut in a specific direction to expose a specific plane as the growth surface.

LED 100 may include a substrate layer 110, which may include, for example, an aluminum oxide ($Al_2O_3$) substrate ("sapphire" substrate) or a GaN substrate. The semiconductor layer 120 may be epitaxially grown on substrate layer 110.

Semiconductor layer 120 may include a Group III-V material, such as GaN, and may be p-doped (e.g., with Mg, Ca, Zn, or Be) or n-doped (e.g., with Si or Ge). In the example shown in FIG. 1, layer 120 is an n-type doped semiconductor material. The active region 130 may include one or more layers grown on semiconductor layer 120. For example, the active region 130 may include one or more indium gallium nitride (InGaN) layers, one or more aluminum indium gallium phosphide (AlInGaP) layers, or one or more GaN layers, which may form one or more heterostructures, such as one or more quantum wells. In the example of FIG. 1, the active region 130 includes a QW matrix. For the sake of simplicity, the QW matrix is not shown in FIG. 1. Examples of QW matrices are described below, for instance, in connection with FIG. 3.

The quantum wells within the active region 130 may be formed by a set of QW layers, with each QW layer operating as a quantum well and adjacent pairs of QW layers being separated by one or more intervening quantum barrier (QB) layers. A QB may comprise any semiconductor material having a wider bandgap relative to the QW that the QB quantum mechanically confines or isolates. Accordingly, the active region 130 may include a wider bandgap semiconductor layer situated between a pair of narrower bandgap QW layers or, more generally, a layered structure that alternates between QB layers and QW layers. However, in some embodiments, an LED may include only one quantum well layer in the active region.

The semiconductor layer 140 may be epitaxially grown on the active region 130. Semiconductor layer 140 may include a III-V material, such as GaN, and may be p-doped (e.g., with Mg, Ca, Zn, or Be) or n-doped (e.g., with Si or Ge). In the example shown in FIG. 1, layer 140 is a p-type doped semiconductor material. Semiconductor layer 120 and semiconductor layer 140 sandwich the active region 130 to form the light emitting diode. For example, LED 100 may include a layer of InGaN situated between a layer of p-type GaN doped with magnesium and a layer of n-type GaN doped with silicon or oxygen. In some embodiments, LED 100 may include a layer of AlInGaP situated between a layer of p-type AlInGaP doped with zinc or magnesium and a layer of n-type AlInGaP doped with selenium, silicon, or tellurium.

To make electrical contact with the semiconductor layer 120 (e.g., an n-GaN layer) of the diode and to more efficiently extract light emitted by the active region 130, the semiconductor layers may be etched to expose semiconductor layer 120 and form a mesa structure (the mesa 102) that includes the layers 120 and 130 as well as the layers of the active region 130. The mesa structure may confine carriers within the injection area of the device. Etching the mesa structure may lead to the formation of mesa side walls—also referred to herein as facets—that may be non-parallel with, or in some cases, orthogonal, to the growth planes. A reflective layer 170 may be formed on the side walls of the mesa structure. Reflective layer 170 may include an oxide layer, such as a silicon oxide ($SiO_2$) layer, and may act as a reflector to reflect emitted light out of LED 100. A contact 180, which may comprise a metal, such as Al, Au, Ni, Ti, or any combination thereof, or a non-metal conductive material, shown as a n-contact in this figure, may be formed on semiconductor layer 120 and may act as an electrode of LED 100. In addition, another contact 190, such as an Al/Ni/Au metal layer, shown as a p-contact in this figure, may be formed to make ohmic contact with semiconductor layer 140 to act as another electrode of LED 100.

When a voltage signal is applied across the contacts 180 and 190, electrons and holes may be injected into and recombine in the active region 130, and the recombination of electrons and holes may result in emission of photons, i.e., light. The wavelength and energy of the emitted photons may depend on the energy bandgap between the valence band and the conduction band in active region 130. For example, InGaN active layers may emit green or blue light, while AlInGaP active layers may emit red, orange, yellow, or green light. The emitted photons may be reflected by the reflective layer 170 and may exit the LED 100, for example, from the bottom side (e.g., through the substrate 110). In some implementations, one or more optical elements (e.g., lenses or waveguides) may be disposed on the light exit surface of the LED 100 to further control the light emission of the LED 100, e.g., through collimation of the emitted light.

When the active region 130 includes a QW matrix, the active region 130 may be divided into an array of smaller (e.g., nano-sized) sub-regions, with each sub-region corresponding to a QW structure that is configured to emit light in response to the voltage applied across the contacts 180 and 190. That is, the QW structures that form the QW matrix may share the contact 180 and the contact 190 so as to be controlled simultaneously using the same voltage signal.

In the example of FIG. 1, the LED 100 has a parabolic mesa. Although the mesa 102 is shown as being parabolic, in some embodiments, the LED 100 may include a mesa of another shape, such as a planar, vertical, conical, or semi-parabolic, and where a base area of the mesa may be circular, rectangular, hexagonal, or triangular. For example, the LED 100 may include a mesa with a curved shape (e.g., paraboloid shape) or a non-curved shape (e.g., conic shape). The mesa may be truncated or non-truncated.

Additionally, although FIG. 1 shows only a single LED, it will be understood that an LED device may include multiple LEDs, e.g., a one-dimensional or two-dimensional array of LEDs, where each LED in the array corresponds to an instance of the LED 100. In some implementations, two or more LEDs in the same array may share a contact (e.g., a shared n-contact and/or a shared p-contact). The LEDs in an LED array may be formed from a shared semiconductor structure, e.g., a stack of semiconductor layers on a substrate. The LEDs may be formed through etching the shared semiconductor structure into a plurality of mesas with voids or trenches between adjacent mesas. In the example of a micro-LED with a lateral dimension of less than 10 micrometers, the void or trench between mesas may be in the range of 0.05 to 7 micrometers in width, with a variety of pitch distances (e.g., center-to-center distance between adjacent mesas) being possible. The number of mesas along a first dimension may be in the thousands, and the number of mesas along a second dimension may also be in the thousands. Just as an example, an array may comprise 1,500 mesas by 1,000 mesas. In another example, an array may comprise 2,000 mesas by 1,500 mesas.

Surface imperfections on the facets of each mesa may contribute to undesirable surface recombination that decreases the efficiency of each LED. At the mesa facets, the atomic lattice structure of the n-type doped semiconductor material, light emitting material, and p-type doped semiconductor material ends abruptly. At these surfaces, atoms of the semiconductor material lack neighbors to which bonds may be attached. This results in "dangling bonds," which are characterized by unpaired valence electrons. These dangling bonds create energy levels within the bandgap of the semiconductor material that otherwise would not exist, causing non-radiative electron-hole recombination at or near the surface of the semiconductor material.

The effects of non-radiative recombination are especially pronounced as the physical size of an LED mesa is reduced to diameters of 10 micrometers and below, especially 5 microns and below. In larger LEDs, e.g., LEDs with a diameter greater than 50 micrometers, the LED area affected by non-radiative surface recombination is relatively small. For example, assuming a diffusion length of 1 micrometer, the effects of non-radiative surface recombination may be limited to those areas within approximately 1 micrometer of the mesa facets. For an LED having a diameter of 50 micrometers, only a small fraction of the interior of the LED is within 1 micrometer of the LED's surface—i.e., mesa facet. Therefore, even though much of the surface recombination activity in an LED occurs within the quantum well layer(s), the LED areas affected by non-radiative surface recombination would not include a significant portion of the active region. By contrast, in a much smaller LED, e.g., 2 micrometers in diameter, the area affected by surface recombination may be quite significant. In such a case, a large percentage of recombination activity may correspond to non-radiative surface recombination near the mesa facets.

Thus, micro-LEDs are particularly susceptible to reduced efficiency in comparison to traditional LEDs, e.g., LEDs with diameters of several millimeters.

Figure 2:
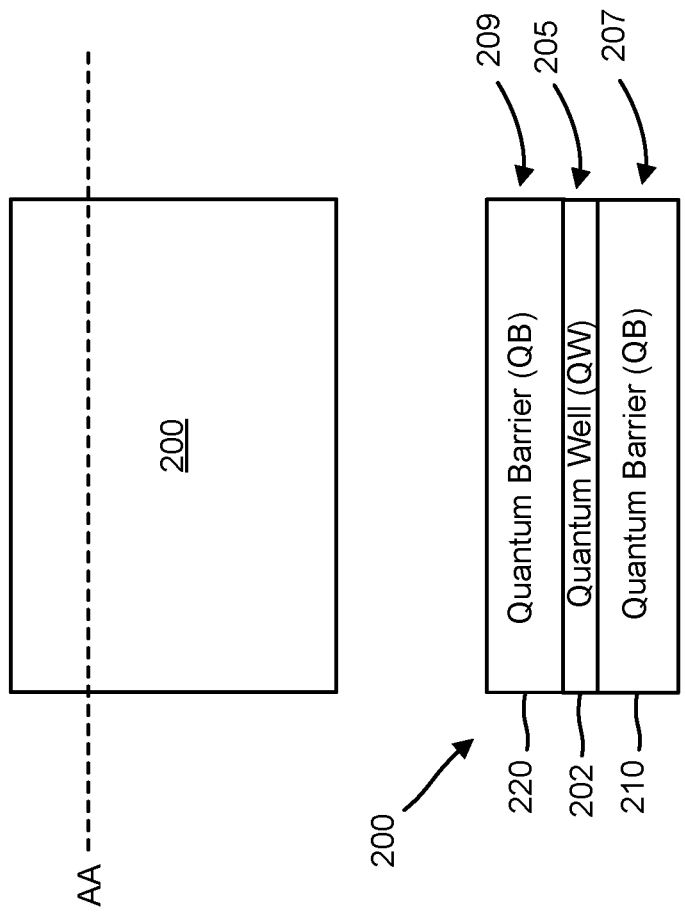
FIG. 2 illustrates an example of a semiconductor structure from which one or more LEDs can be formed.

FIG. 2 shows a top-down view of a semiconductor structure 200 from which one or more LEDs can be formed. FIG. 2 includes a cross-section of the semiconductor structure 200 along line AA. As seen in the cross-sectional view, the semiconductor structure includes a QW layer 202 situated between a first QB layer 210 and a second QB layer 220. The QW layer 202 corresponds to a quantum well from which light can be emitted after the semiconductor structure 200 has been processed into one or more LEDs. The QW layer 202 can include, for example, one or more of the following: indium gallium nitride (InGaN), indium gallium phosphide (AlInGaP), indium gallium phosphide (InGaP), gallium arsenide phosphide (GaAsP), or gallium nitride (GaN). The layers 202, 210, and 220, in particular the QW layer 202, may correspond to an active region of an LED. Additional layers that may be included in an LED are omitted from FIG. 2 for the sake of simplicity. For example, from the discussion of FIG. 1, it will be understood that a p-doped semiconductor layer may be formed on the QB layer 220 and, similarly, an n-doped semiconductor layer may be formed on the QB layer 210. Further, the various layers of the LED, including the layers 202, 210, and 220, may each be grown on top of a substrate, e.g., the substrate 110.

Although depicted as a single layer, the QW layer 202 can be an MQWs layer containing a plurality of QW layers that are separated by "local" quantum barriers. In other words, separate from the QB layers 210 and 220, the area corresponding to the QW layer 202 could include one or more additional QB layers. As mentioned above, a QB may comprise any semiconductor material having a wider bandgap relative to the QW that the QB quantum mechanically confines or isolates. In the context of the semiconductor structure 200, this means that the QB layers 210 and 220 have a wider bandgap than the quantum well in the QW layer 202. Similarly, if the QW layer 202 is an MQWs layer, the local quantum barriers within the QW layer 202 would have a wider bandgap than the quantum wells in the QW layer 202.

The semiconductor material from which the local QBs (if any) in the QW layer 202 are formed can be the same or different than that from which the QB layers 210 and 220 are formed. Likewise, the QB layer 210 can be formed from the same or a different semiconductor material than the QB layer 220. In some embodiments, the materials from which the local QBs, the QB layer 210, and the QB layer 220 are formed may be identical or at least partially overlapping. A quantum barrier layer may, for example, include gallium nitride (GaN), aluminum gallium nitride (AlGaN), indium gallium nitride (InGaN), or aluminum gallium indium nitride (AlGaInN). Other suitable materials for a quantum barrier layer include, for example, aluminum indium phosphide (AlInP), aluminum gallium arsenide (AlGaAs) or aluminum indium gallium arsenide phosphide (AlInGaAsP). Additionally, a quantum barrier layer may be configured as a hybrid barrier with sub-layers that are formed from different materials. For example, the QB layer 210 and/or the QB layer 220 could include a thinner AlGaN barrier followed by a thicker GaN barrier. An example composition of the semiconductor structure 200 is as follows: QB layer 210—AlGaInP, QW layer 210—GaInP, QB layer 220—AlGaInP.

The semiconductor structure 200 can be etched into one or more mesa shapes, each mesa corresponding to a separate LED. However, for discussion purposes, assume that the entire semiconductor structure 200 will be etched into a single mesa with sidewalls that extend along the edges of each of the layers 202, 210, and 220. Mesa etching tends to expose surface imperfections along the resulting facets (e.g., the mesa sidewalls), surface imperfections which lead to non-radiative recombination. Such surface imperfections are often more prevalent in the QW layers than the quantum barrier layers. For example, 90% of the surface imperfections along a sidewall of the mesa could lie along the edges of the QW layer 202 (e.g., an edge 205), while the remaining 10% may be distributed along edges of the QB layers 210 and 220 (e.g., edges 207 and 209, respectively). Moreover, the effects of the surface imperfections within the QW layer 202 may be more severe since QW layers are more prone to surface recombination. To reduce non-radiative recombination, aspects of the present disclosure relate to forming an active region that is segmented into discrete QW structures instead of having a monolithic active region such as the active region corresponding to the QW layer 202. An example of a segmented active region is shown in FIG. 3.

Figure 3:
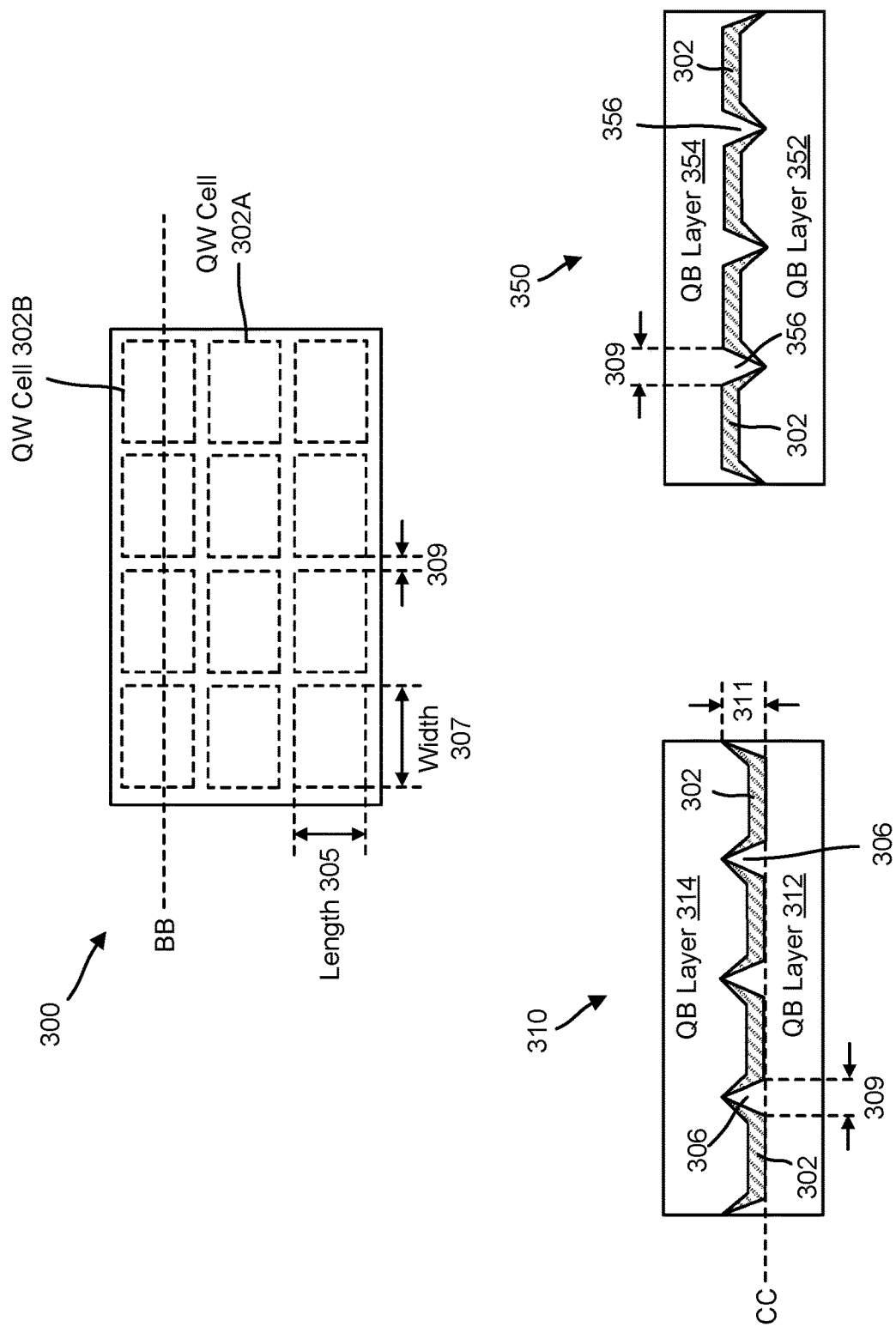
FIG. 3 illustrates examples of a semiconductor structure including an active region that has been segmented into a QW matrix, according to some embodiments.
Figure 4:
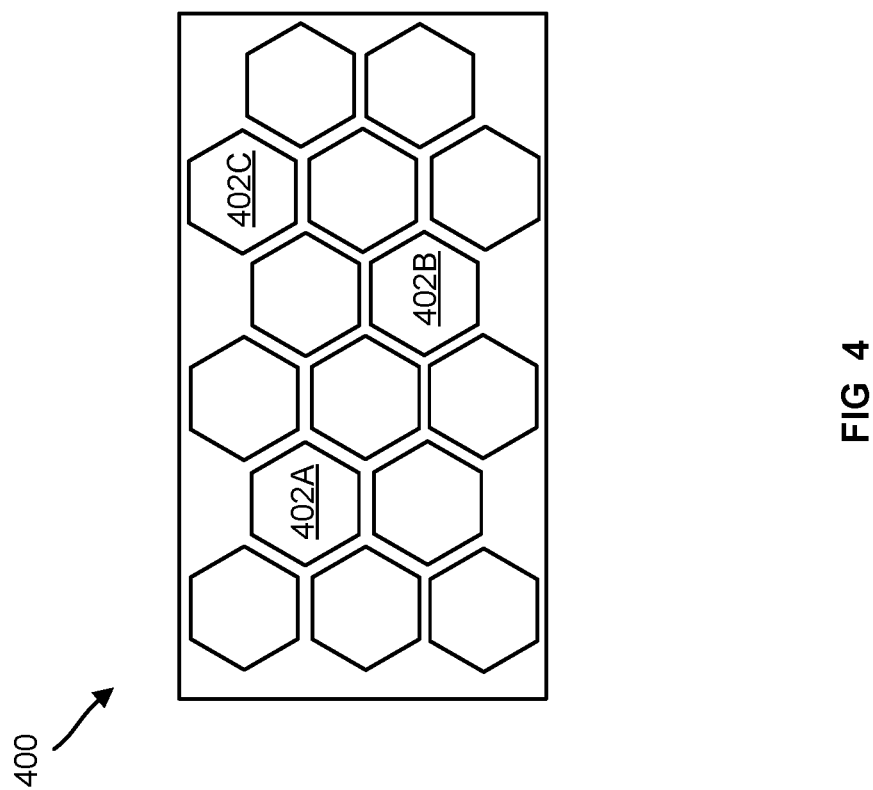
FIG. 4 illustrates an example of a semiconductor structure including a segmented active region, according to some embodiments.

FIG. 3 shows a top-down view of a semiconductor structure 300 including a segmented active region, according to some embodiments. FIG. 3 also includes cross-sectional views, taken along line BB, of two example implementations (310 and 350) of the semiconductor structure 300. As with FIG. 2, additional layers (e.g., layers analogous to substrate 110, n-type layer 120, and p-type layer 140 in FIG. 1) are omitted. As seen in the top-down view, the active region is divided into a plurality of cells 302, e.g., a first cell 302A and a second cell 302B. Each cell 302 is a QW structure that has a substantially rectangular (e.g., square) profile, defined by a length 305 and a width 307. However, other cell shapes are possible, for example, hexagonal, as shown in FIG. 4. In the example of FIG. 3, the cells 302 form a two-dimensional array in which the cells 302 are arranged into rows and columns, with adjacent cells being spaced apart by a stripe width or distance 309. The distance 309 may be substantially uniform throughout the active region such that the distance to an adjacent cell is approximately the same along each side of a cell. However, as indicated in the cross-sectional views, the distance between cells may vary along the vertical direction such that adjacent cells 302 approach or meet to define the boundaries for a ridge-shaped portion of a QB layer. If the semiconductor structure 300 is used to form a micro-LED, then the cells 302 may be nanoscale. For example, the distance 309 may range from 25 to 100 nanometers (nm), the length 305 and the width 307 may range from 50 to 200 nm, and the height (311) of the QW cells may range from 60 to 90 nm.

On the left side of FIG. 3, the semiconductor structure 310 includes a QB layer 312 and a QB layer 314. Each cell 302 corresponds to an individual light emission region and includes at least one quantum well. In some embodiments, a cell 302 is an MQW cell that includes two or more QW layers and at least one local QB layer. The cells 302 are sandwiched between the QB layers 312 and 314. The QB layer 312 and the QB layer 314 may correspond to the first QB layer and the last QB layer in the semiconductor structure 310, respectively. That is, the QB layer 312 can be the first quantum barrier grown, and the QB layer 314 can be the last quantum barrier grown. The QB layer 312 includes structures 306 that project into the area between adjacent cells 302 to separate the cells. Each structure 306 is bounded by the sidewalls of a pair of adjacent cells 302. The structures 306 are ridge-shaped and taper so that the distance between adjacent cells decreases in the direction of the QB layer 314. As indicated above, the cells 302 can be nanoscale. Accordingly, the structures 306 can also be nanostructures. The QB layer 312, in particular the structures 306, operates to quantum mechanically isolate the cells 302. The mechanism by which such isolation occurs is described below.

On the right side of FIG. 3, the semiconductor structure 350 includes a QB layer 352 and a QB layer 354. In the semiconductor structure 350, the cells 302 are quantum mechanically isolated by structures 356 located in the QB layer 354. Like the structures 306, the structures 356 can be nanostructures bounded by the sidewalls of adjacent cells 302. The structures 356 taper toward the QB layer 352 and are shaped similarly to the structures 306, but oriented in the opposite direction.

FIG. 4 shows a semiconductor structure 400 including a segmented active region, according to some embodiments. The active region of the semiconductor structure 400 includes QW cells 402 that are hexagonal. In general, the cross-sectional profile of a QW cell can be of any geometric shape. Further, as indicated in FIG. 3, the thickness of a QW cell may vary. For example, FIG. 3 shows the cells 302 as being thinner near the structures 306 and 356. As explained below, this difference in thickness may be a result of preferential growth in which more quantum well material is formed at the flat regions of a QB layer relative to the sloped regions. Therefore, cells 402 are not necessarily uniform hexagons when viewed in three dimensions. In FIG. 4, the cells 402 are shown using solid lines to indicate that the view is a cross-section through the plane of maximal separation between the cells 402, e.g., along line CC in FIG. 3. By contrast, in the top-down view of FIG. 3, the cells 302 are shown in dashed lines to indicate that the cells 302 are hidden underneath the QB layer 314 or the QB layer 354.

Figure 5:
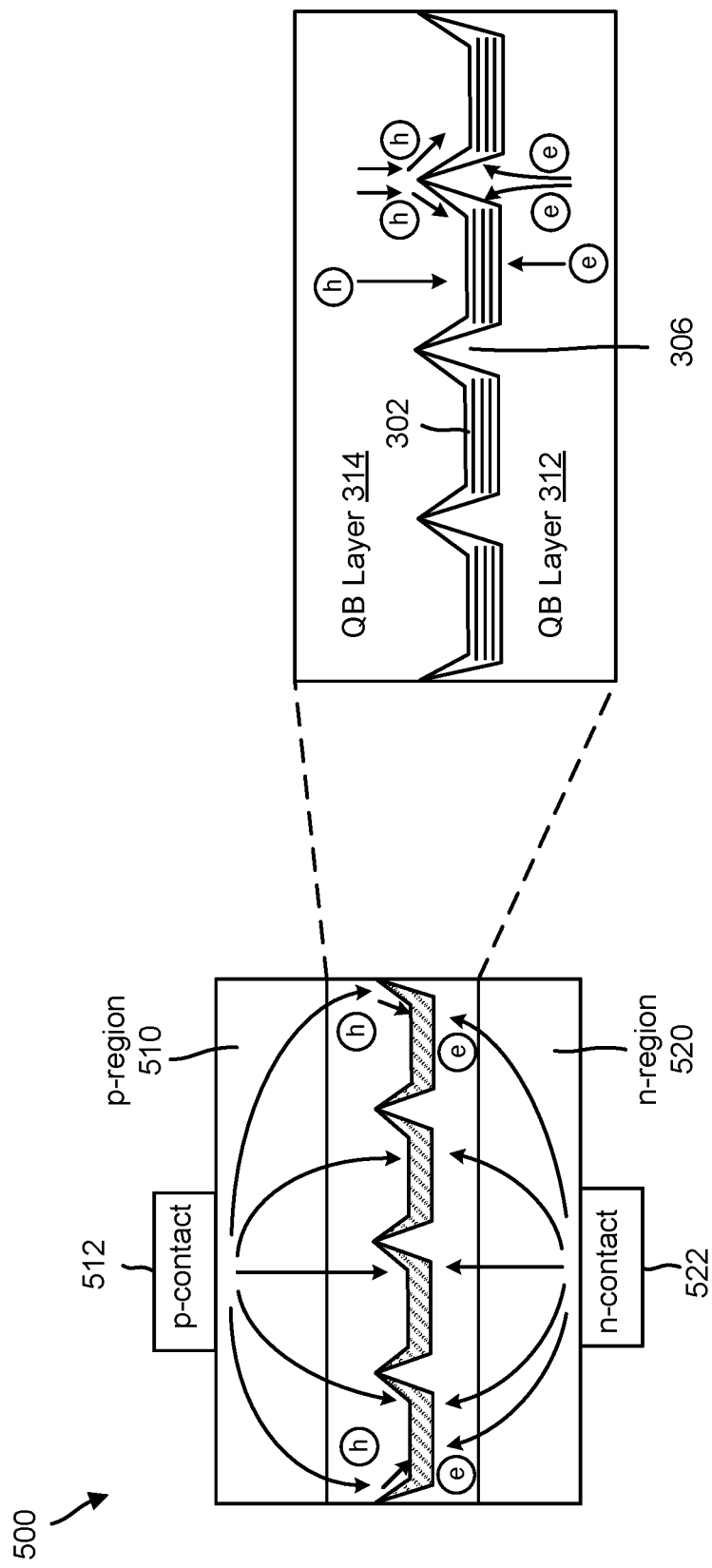
FIG. 5 illustrates the effect of isolated QW structures in a QW matrix, according to some embodiments.

FIG. 5 illustrates the effect of isolated QW structures in a QW matrix, according to some embodiments. In FIG. 5, an LED 500 is configured to include an active region corresponding to the semiconductor structure 310 of FIG. 3. The active region of the LED 500 is shown in enlarged detail in the inset image, where the cells 302 are depicted as being MQW cells. The LED 500 further includes a p-region 510 (e.g., a region encompassing semiconductor layer 140 in FIG. 1), an n-region 520 (e.g., a region encompassing semiconductor layer 120), a p-contact 512, and an n-contact 522. When a voltage is applied across the p-contact 512 and the n-contact 522, charge carriers are mobilized toward the active region. Specifically, holes (h) are injected from the p-region 510 toward the quantum wells of the active region (the cells 302). Similarly, electrons (e) are injected from the n-region 520 toward the cells 302. When the electrons and holes recombine in the quantum wells, light is emitted.

As shown in FIG. 5, the injected carriers exhibit a quantum mechanical preference for the flat (central) regions of the cells 302. In this example, the flat regions correspond to the bottom of each cell 302. Thus, the electrons and holes tend to move toward (and stay within) the bottoms of the cells 302, thereby maximizing their availability for radiative (light-emitting) recombination. In the example of semiconductor structure 350, the flat regions correspond to the tops of the cells 302.

One factor that may contribute to the preference of the carriers for the flat regions of the cells 302 is the structures 306 of the QB layer 312. The structures 306 provide lateral separation between adjacent QW structures to reduce or prevent migration (e.g., lateral diffusion) of carriers in a QW structure across the barrier provided by the QB layer 312. Consequently, migration of carriers to the etched mesa sidewall regions (where the defect density and thus nonradiative recombination may be high) is also reduced or prevented.

Another factor that may contribute to the preference of the carriers for the flat regions of the cells 302 is the nonuniform distribution of quantum well material within each cell 302. The QWs may be significantly thinner at the sloped (peripheral) regions of the cells 302, which are adjacent to and abut the structures 306. Further, the sloped regions of the cells may have a wider bandgap due to having a different proportion of quantum well material (e.g., lower indium content) relative to the central regions. The thinness and wider bandgap at the periphery of the cells 302 may further enhance the local confinement of carriers.

Having a wider bandgap at the cell periphery means injected charge carriers may diffuse to and be confined in the central region of the cell. Further, as the physical thickness of a QW decreases, the difference between the energy states of the charge carriers will increase correspondingly. For example, the difference between the ground level energy states of holes and electrons may become larger because the ground level energy state in a narrower QW may be increased in the case of an electron but decreased in the case of a hole. In other words, the average energy of electrons in a narrower QW will be higher than that of a wider QW. This is shown in FIGS. 6A and 6B and is another reason why charge carriers in the thinner QW areas may diffuse to and be confined in the central region, where the ground level energy state of electrons and the difference between ground level energy states of electrons and holes are lower.

Figure 6B:
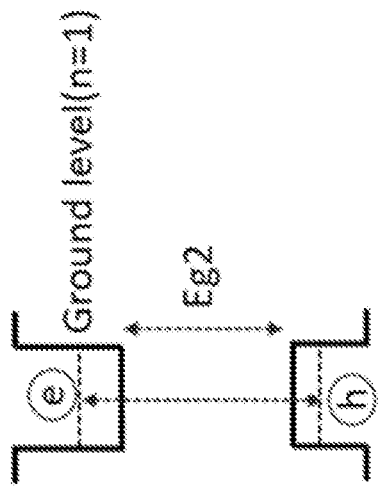
FIGS. 6A and 6B illustrate the effect of thicker versus thinner quantum wells.
Figure 6A:
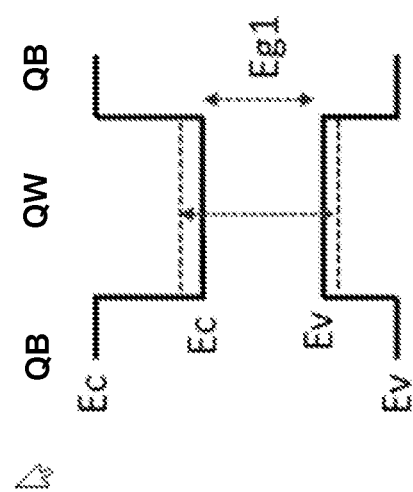

FIGS. 6A and 6B illustrate the effect of thicker versus thinner quantum wells. FIGS. 6A and 6B each show a bandgap diagram for a heterostructure comprising a first QB followed by a QW and then a second QB, which may correspond to the QB layer 312, a QW cell 302, and the QB layer 314, respectively. In FIG. 6A, the quantum well is thicker compared to FIG. 6B. Thus, FIG. 6A may be more representative of the energy states in the central regions of the cells 302, whereas FIG. 6B may be more representative of the energy states at the edges of the cells 302. As shown in FIG. 6A, the difference between ground level energy states of the charge carriers is smaller in magnitude compared to the ground level energy state difference in FIG. 6B. Similarly, the bandgap (Eg1) between the conduction band (Ec) and the valence band (Ev) in FIG. 6A is smaller than the bandgap (Eg2) in FIG. 6B.

Figure 7:
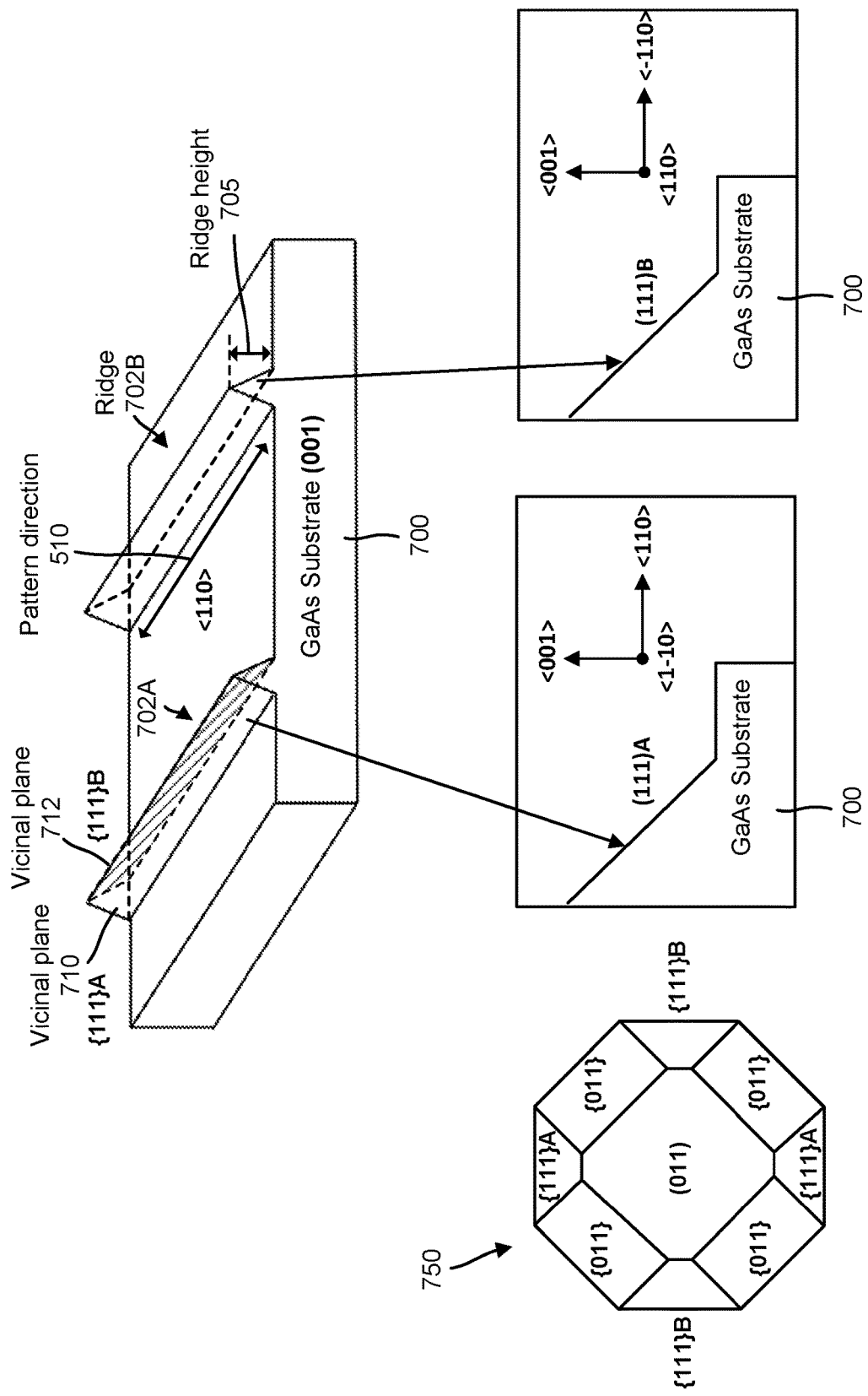
FIG. 7 illustrates an example of ridges formed on a substrate, according to some embodiments.

FIG. 7 illustrates an example of ridges 702A and 702B formed on a substrate 700, according to some embodiments. The ridges 702A, 702B define the borders of an area in which a QW cell can be grown. For simplicity, only two ridges are shown. However, it will be understood, for example, in view of the disclosure concerning FIG. 3, that additional ridges can be formed on the substrate 700 to fully enclose the perimeter of each area corresponding to a QW cell. Likewise, grooves can be formed to fully enclose the perimeter of each QW cell in a QW matrix.

Each ridge 702 is defined by a pair of surfaces corresponding to vicinal planes in the crystal lattice of the substrate 700. For example, the ridge 702A includes a vicinal plane 710 and a vicinal plane 712. The vicinal plane 712 is shown using cross-hatching. Both of the vicinal planes 710, 712 may be {111} planes. Here, curly brackets { } denote equivalent planes, angled brackets 0 denote equivalent directions, and parentheses ( ) denote a specific plane, in accordance with Miller indices conventions. In FIG. 7, the substrate 700 comprises GaAs, which has a crystal structure 750. One side of each ridge corresponds to a {111} A plane, shown in the left inset image. The other side of the ridge corresponds to a {111} B plane, shown in the right inset image. Each ridge 702 has a height 705 that roughly corresponds to the height of QW cell. The ridges 702 can be formed through electron-beam (e-beam) lithography at an angle ranging from 50-60° to approximate the {111} planes, where the (001) plane corresponds to 0°, the (110) plane corresponds to 90°, and the {111} planes correspond to 54.7°. As shown in FIG. 7, the substrate 700 can be patterned along the <110> and <1-10> crystallographic directions to achieve a desired length for each ridge 702. Grooves may be formed in a similar manner, through appropriate selection of the angles and directions for patterning a template (e.g., the substrate 700).

Figure 8:
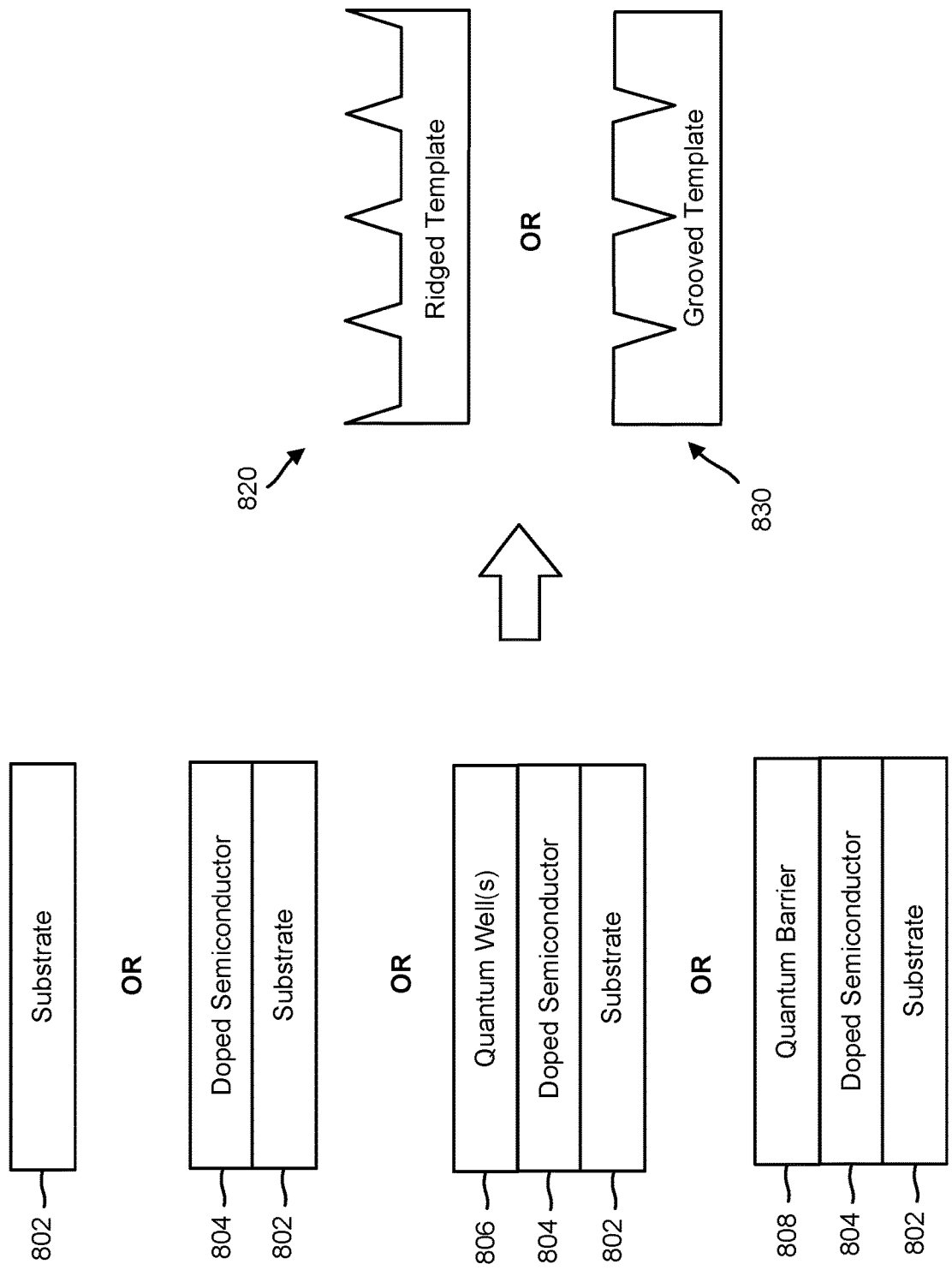
FIG. 8 illustrates examples of templates on which ridges or grooves can be formed, according to some embodiments.

FIG. 8 illustrates examples of templates on which ridges or grooves can be formed, according to some embodiments. As shown in FIG. 8, a ridged template 820 or a grooved template 830 can be formed from a base template comprising a bare substrate 802 (e.g., a GaAs substrate). The base template can also include the substrate 802 in combination with one or more semiconductor layers grown on top. For example, the base template can include a doped semiconductor 804 (e.g., n-type or p-type). In some instances, the base template may even include one or more quantum wells 806. For example, substrate 802 may include GaAs, doped semiconductor 804 may include n-doped AlGaInP, and the quantum wells 806 may include MQWs epitaxially grown over the doped semiconductor 804 using metal organic chemical vapor deposition (MOCVD). Accordingly, grooves or ridges can extend to a depth that reaches the substrate 802, the doped semiconductor 804, and/or the quantum wells 806.

As yet another possibility, the base template may include the substrate 802, the doped semiconductor 804, and a quantum barrier 808. The quantum barrier 808 may, for example, correspond to the QB layer 312 or the QB layer 352 in FIG. 3. Based on the examples in FIG. 8, it will therefore be understood that the ridge template 820 or the grooved template 830 can be etched into a three-dimensional (3D) shape having flat portions and sloped portions, with the sloped portions corresponding to areas between QW cells, e.g., the locations of nanostructures in a QB layer that will quantum mechanically isolate the QW cells. Further, the nanostructures of the QB layer may be etched into the QB layer (e.g., when the template includes the quantum barrier 808) or subsequently formed when a layer of quantum barrier material is grown over the template 820, 830 (e.g., as a final quantum barrier on top of the QW cells or as an initial quantum barrier between the doped semiconductor 804 and the QW cells).

Figure 9:
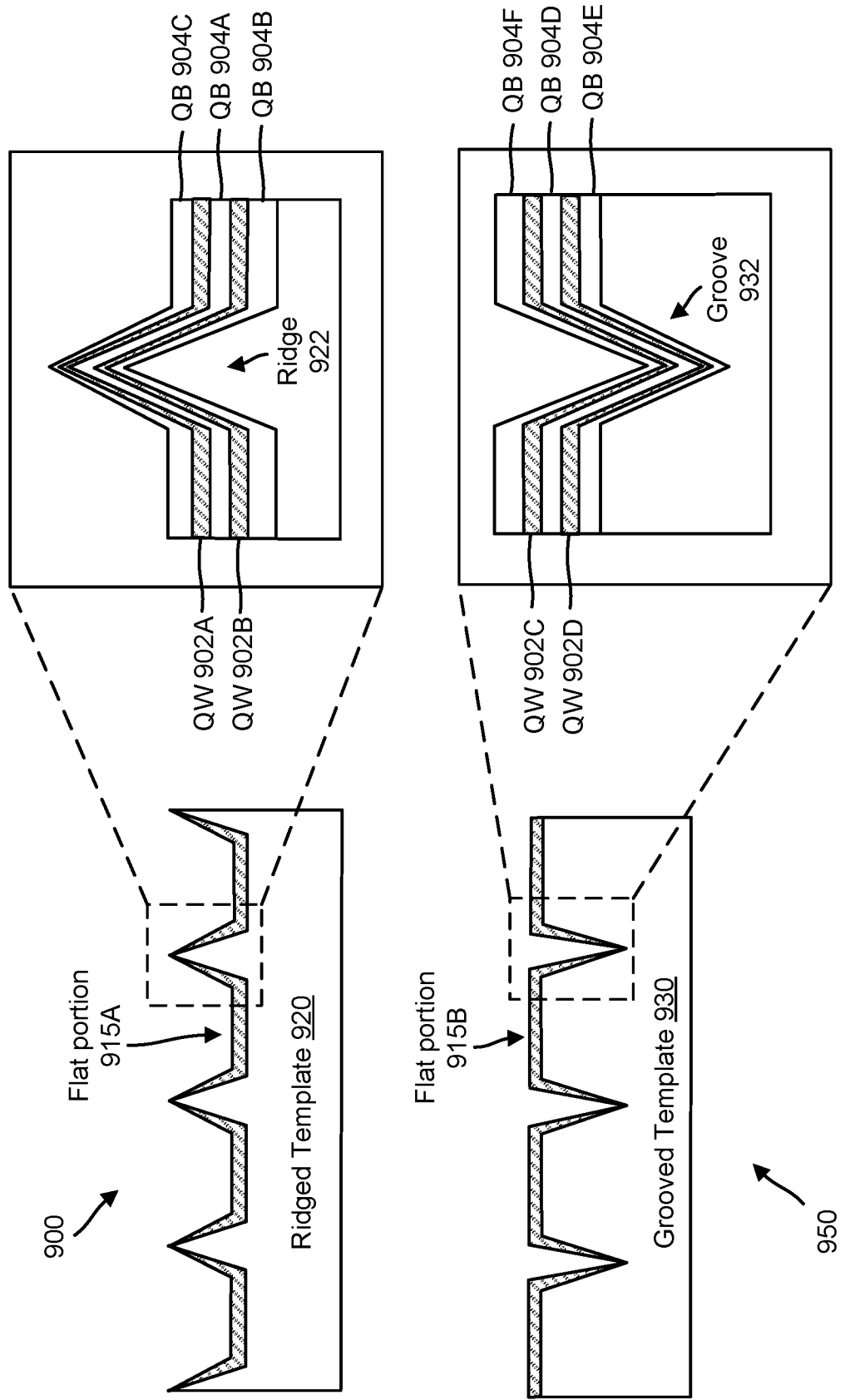
FIG. 9 illustrates MQWs grown on templates, according to some embodiments.

FIG. 9 illustrates MQWs grown on templates, according to some embodiments. As shown, a semiconductor structure 900 may include a ridged template 920 with a QW 902A and a QW 902B between a QB 904A. The QW 902B may be formed over a QB 904B, with the QB 904B being the first quantum barrier layer grown on top of a ridge 922. An additional QB 904C may be grown on top of the QW 902A. Similarly, a semiconductor structure 950 may include a grooved template 930 with a QW 902C and a QW 902D between a QB 904D. The QW 902D may be formed over a QB 904E, with the QB 904E being the first quantum barrier layer grown on top of a groove 932. An additional QB 904F may be grown on top of the QW 902C.

The MQWs in FIG. 9 can be formed using epitaxial growth in which the ridge template 920 or the grooved template 930 is exposed to an appropriate composition of gases (e.g., a mix of Ga and In) to inject adatoms onto the exposed surfaces of the ridges or grooves. The vicinal surfaces along the ridges/grooves tend to have lower adatom density compared to the flat surfaces, e.g., a flat region 915A of a QW cell in the ridged template 920 or a flat region 915B of a QW cell in the grooved template 930. Consequently, the QWs 902 may be substantially thinner along the vicinal surfaces. As indicated in the discussion of FIGS. 6A and 6B above, thinner quantum wells are associated with higher energy states for electrons and higher differences between the ground level energy states of electrons and holes. Consequently, the thinner regions of the QWs 902 at the vicinal surfaces (e.g., along the {111} planes in FIG. 7) may contribute to quantum mechanical isolation of charge carriers injected into the flat regions of the quantum wells.

Additionally, as discussed above, the vicinal surfaces may have a wider bandgap compared to the flat regions due to a difference in composition. For example, the wider bandgap at the vicinal surfaces may be a result of fewer indium adatoms being deposited on the vicinal surfaces, and this may be another contributing factor to quantum mechanical isolation.

Figure 10:
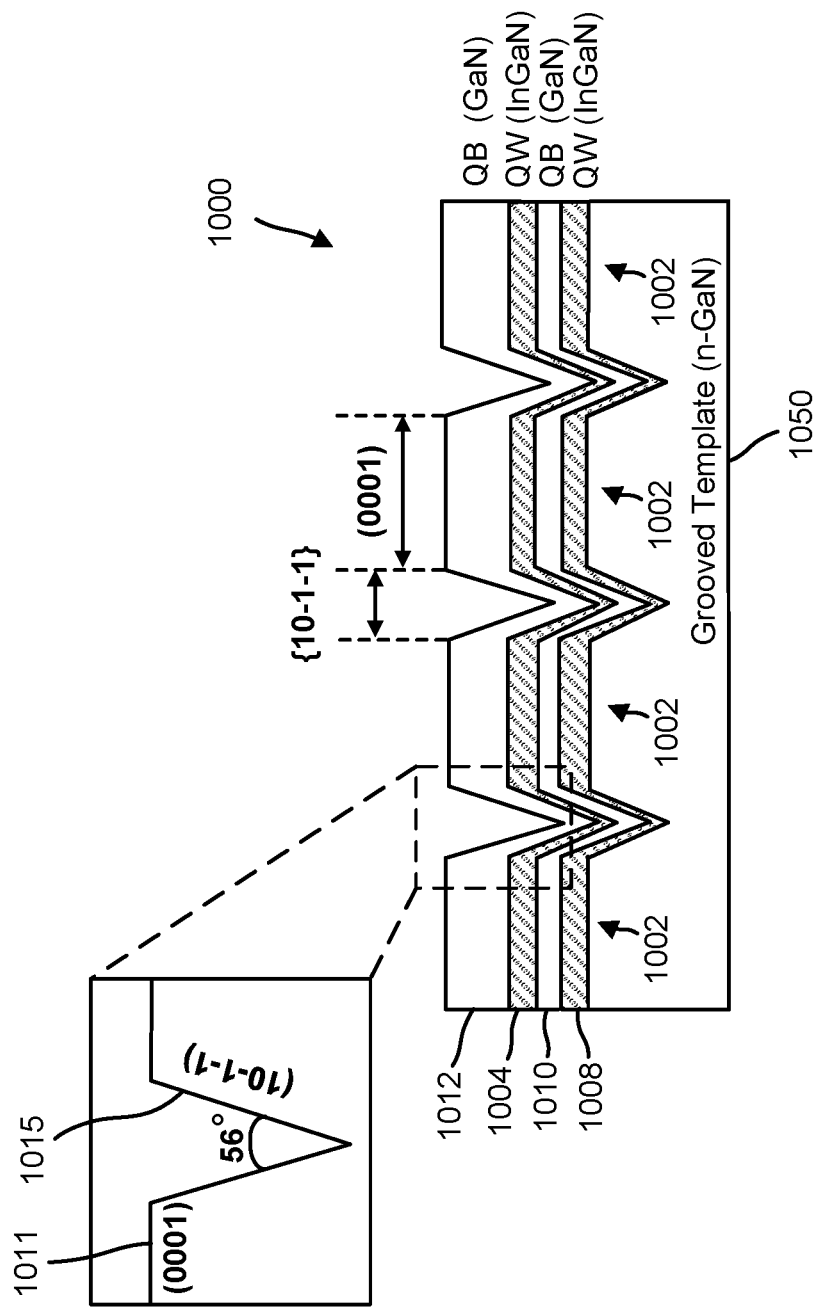
FIG. 10 illustrates an example of a semiconductor structure usable for creating an LED mesa, according to some embodiments.

FIG. 10 illustrates an example of a semiconductor structure 1000 usable for creating an LED mesa, according to some embodiments. The semiconductor structure 1000 includes a set of QW cells 1002. Each QW cell 1002 includes a first quantum well corresponding to a QW layer 1004 and a second quantum well corresponding to a QW layer 1008. The first quantum well and the second quantum well are separated by a QB layer 1010 that operates as a local quantum barrier for each QW cell. An additional QB layer 1012 is formed on top of the QW layer 1004. The QW layers 1004, 1008 and the QB layers 1010, 1012 are grown on top of a grooved template 1050. In this example, the template 1050 comprises n-doped GaN (n-GaN). For example, the template 1050 may include an intrinsic GaN substrate doped with an n-type dopant to form an n-region in the GaN substrate. When the layers 1004, 1008, 1010, and 1012 are grown on the template 1050, each of these layers substantially conforms to the geometry of the grooves, which have a 56° angle. As shown, a flat portion 1011 of the QB layer 1012 is oriented along a (0001) plane, and a sloped portion 1015 corresponding to a structure separating a pair of adjacent QW cells is oriented along a {10-1-1} plane.

In certain embodiments, the semiconductor structure 1000 may be formed using the following steps. First, the template 1050 is created by patterning an n-GaN wafer using ex-situ e-beam lithography (with positive or negative photoresist) and dry-etching to create grooves. After the grooves have been created, the template 1050 can be chemically cleaned, e.g., using a combination of ex-situ chemical wet-etch cleaning and in-situ thermo-chemical cleaning to remove oxide and damage from the dry-etched surfaces. The thermo-chemical cleaning can be performed under high temperature in an epitaxial reactor, using one or more gases such as $H_2$ or $NH_3$. In some embodiments, the ex-situ phase of the cleaning may involve different or additional agents, such as acetone, methanol, or deionized water in an ultrasonic bath, followed by an isopropyl alcohol rinse. Similarly, the in-situ phase of the cleaning may involve different or additional agents, such as $AsH_3$, $PH_3$ or $N_2$ prior to regrowth. The choice of cleaning agents may depend on how the template is structured, for example, on the material composition of the layer(s) that are etched during the patterning.

After cleaning, the dry-etched surfaces may be further repaired using multi-layer deposition to create a superlattice corresponding to the combination of the n-GaN material of the template plus one or more additional layers of compatible semiconductor materials, e.g., n-doped InGaN (n-InGaN) and GaN. The resulting superlattice may provide a high quality crystalline surface along the grooves for growth of the quantum wells and quantum barriers.

The QW layers 1004, 1008 may be formed through epitaxial regrowth of InGaN. Similarly, the QB layers 1010, 1012 may be formed through epitaxial regrowth of GaN. Due to the geometry of the grooves, the injected adatom density of the regrowth materials along the vicinal planes of the grooves, e.g., a (10-1-1) plane, may be significantly lower than along the (0001) plane, resulting in a lower growth rate on the groove surfaces. Additionally, due to thermodynamic instability of the In atoms, the InGaN grown on the groove surfaces may have a significantly lower In composition than the InGaN grown on the flat surfaces oriented along the (0001) plane. Thus, the QW layers 1004, 1008 may be thinner along the groove surfaces that define the sidewalls of each QW cell 1002 and thicker along the flat regions of each QW cell.

Figure 11A:
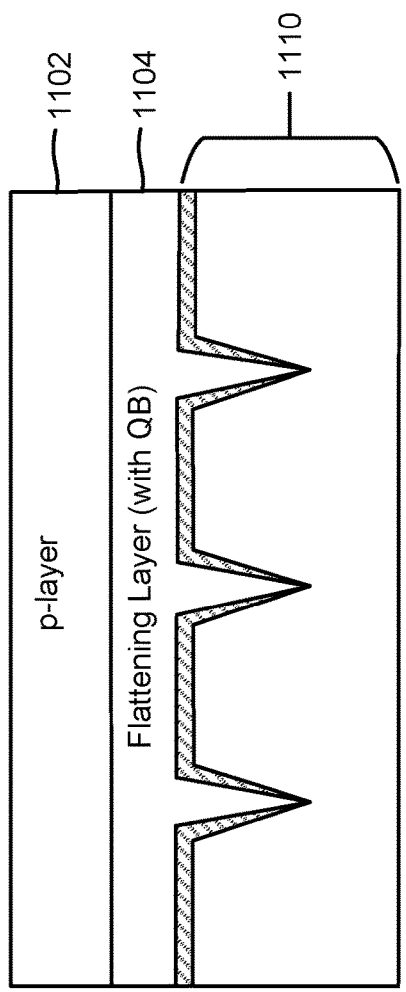
FIGS. 11A and 11B illustrate examples of semiconductor structures usable for creating an LED mesa, according to some embodiments.

FIG. 11A illustrates an example of a semiconductor structure 1100 usable for creating an LED mesa, according to some embodiments. The semiconductor structure 1100 includes a p-doped semiconductor layer 1102 and a flattening layer 1104 formed on top of a structure 1110. The structure 1110 includes QW cells formed on a grooved template and may, for example, correspond to the semiconductor structure 1000 in FIG. 10 or the semiconductor structure 950 in FIG. 9.

The p-doped semiconductor layer 1102 can be formed on top of the flattening layer 1104 and may comprise a III-V semiconductor that is epitaxially grown in conditions that are optimized for hole injection efficiency. In some embodiments, the p-doped semiconductor layer 1102 may include a p-layer plus a highly doped p-layer, with the highly doped p-layer providing ohmic contact to a p-contact (e.g., the p-contact 190 in FIG. 1).

The flattening layer 1104 may include a QB layer alone or in combination with one or more additional layers and can be grown with an enhanced lateral diffusion rate of adatoms, at a higher temperature and/or a lower growth rate compared to the quantum well layers (not shown) that form the QW cells. The flattening layer 1104 may for example, correspond to the QB layer 354 in FIG. 3. In some embodiments, the flattening layer 1104 may include a QB layer in combination with a p-type electron blocking layer (p-EBL). Alternatively, the flattening layer 1104 may include a QB layer, a p-EBL, plus a lightly doped (relative to the layer 1102) p-layer. The QB portion of the flattening layer 1104 may be undoped and substantially thicker in comparison to the local QBs in the QW cells (e.g., the QB 904D in FIG. 9).

Figure 11B:
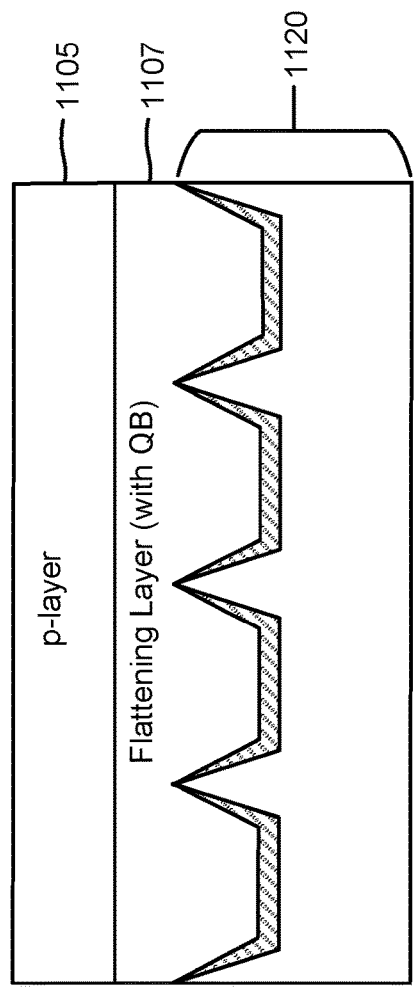

FIG. 11B illustrates an example of a semiconductor structure 1150 usable for creating an LED mesa, according to some embodiments. The semiconductor structure 1150 can be formed in a similar manner to the semiconductor structure 1100 in FIG. 11A and includes a p-doped semiconductor layer 1105 and a flattening layer 1107 formed on top of a structure 1120. The structure 1120 includes QW cells formed on a ridged template and may, for example, correspond to the semiconductor structure 900 in FIG. 9.

The p-doped semiconductor layer 1105 can be formed on top of the flattening layer 1107 and may comprise a III-V semiconductor that is epitaxially grown in conditions that are optimized for hole injection efficiency. In some embodiments, the p-doped semiconductor layer 1105 may include a p-layer plus a highly doped p-layer, with the highly doped p-layer providing ohmic contact to a p-contact (e.g., the p-contact 190 in FIG. 1).

The flattening layer 1107 may include a QB layer alone or in combination with one or more additional layers and can be grown with an enhanced lateral diffusion rate of adatoms, at a higher temperature and/or a lower growth rate compared to the quantum well layers (not shown) that form the QW cells. The flattening layer 1107 may for example, correspond to the QB layer 314 in FIG. 3. In some embodiments, the flattening layer 1107 may include a QB layer in combination with a p-EBL. Alternatively, the flattening layer 1107 may include a QB layer, a p-EBL, plus a lightly doped (relative to the layer 1105) p-layer. The QB portion of the flattening layer 1107 may be undoped and substantially thicker in comparison to the local QBs in the QW cells (e.g., the QB 904A in FIG. 9).

Figure 12:
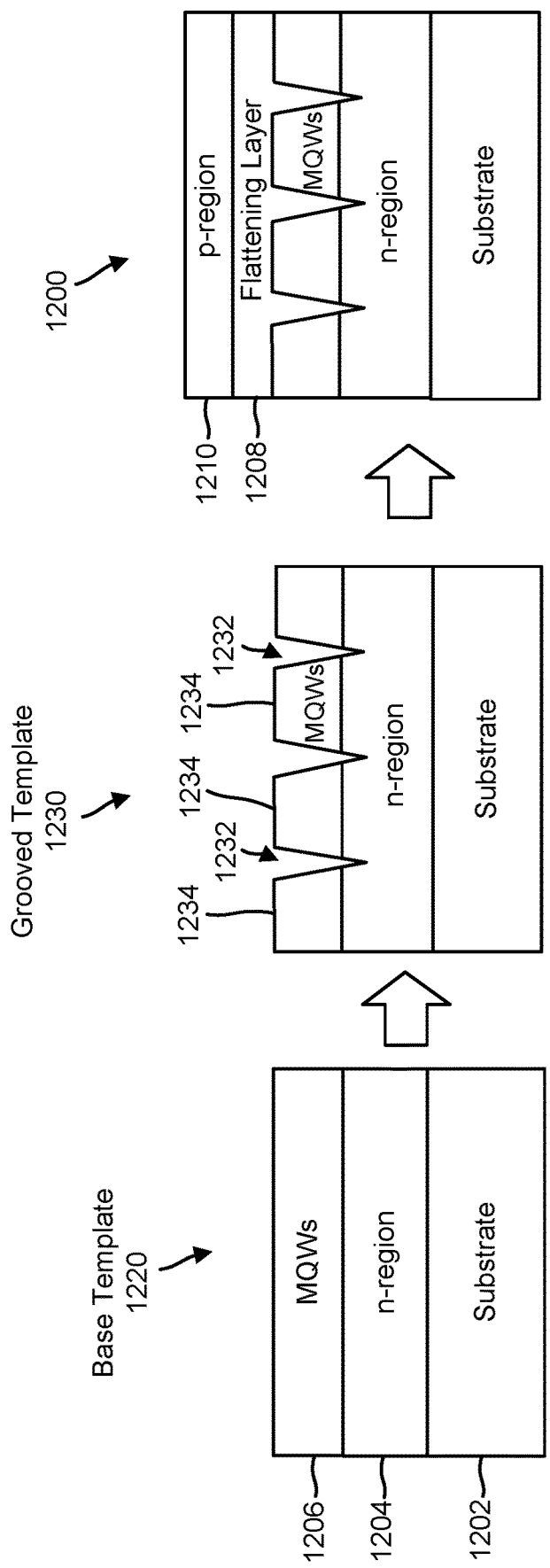
FIG. 12 illustrates an example of a process for creating a semiconductor structure from a template having existing quantum wells, according to some embodiments.

FIG. 12 illustrates an example of a process for creating a semiconductor structure 1200 from a template having existing quantum wells, according to some embodiments. The process in FIG. 12 can begin with a base template 1220, which is a semiconductor structure including a substrate 1202, a doped-semiconductor layer (e.g., an n-region 1204), and an MQWs layer 1206. The substrate 1202 may correspond to the substrate 802 in FIG. 8 and can be formed using GaAs or some other suitable substrate material (e.g., sapphire or GaN, as discussed above in reference to FIG. 1).

The n-region 1204 may correspond to the doped semiconductor 804 in FIG. 8 and can include a layer of Group III-V material (e.g., AlGaInP) that has been doped with an n-type dopant, e.g., with selenium (Se) to form an n-AlGaInP layer. The MQWs layer 1206 may correspond to the quantum wells 806 in FIG. 8 and can include a stack of QB and QW layers, similar to FIG. 9. In particular, the MQWs layer 1206 may include alternating layers of QB and QW materials, with at least two QW layers operating as quantum wells.

The base template 1220 can be patterned to form a grooved template 1230 with grooves 1232 that extend through the MQWs layer 1206. As shown in FIG. 12, the grooves 1232 may also extend partially into the n-region 1204. The grooves 1232 can be formed in a similar manner as described in examples above, for instance, using e-beam lithography and dry-etching. The grooves 1232 may define the boundaries of QW cells 1234 that are arranged in a two-dimensional matrix, similar to the QW cells 302 in FIG. 3. For example, if a rectangular cross-sectional profile is desired for a QW cell 1234, the sides of each QW cell 1234 may correspond to the intersection of a first pair of grooves 1232 and a second pair of grooves 1232 that are orthogonal to the first pair of grooves. Together, both pairs of grooves may define the boundaries of a QW cell that has a three-dimensional shape similar to a truncated pyramid.

To form the semiconductor structure 1200, a flattening layer 1208 can be added on top of the MQWs layer 1206. The flattening layer 1208 may be epitaxially grown (e.g., to form an undoped AlInP quantum barrier) after surface preparation of the grooved template 1230. The surface preparation may involve a combination of ex-situ wet-etching and in-situ cleaning, as discussed above in reference to FIG. 10. Lastly, a p-region 1210 may be formed on top of the flattening layer 1208. In some embodiments, the flattening layer 1208 may be planarized, e.g., using chemical-mechanical planarization (CMP), to produce a substantially planar growth surface for the p-region 1210. The p-region 1210 can include a layer of Group III-V material (e.g., AlInP or GaP) that has been doped with a p-type dopant, e.g., with zinc (Zn) or magnesium (Mg) to form a p-AlInP layer.

The semiconductor structure 1200 can be further processed to form an LED. Additional processing steps may include, for example, depositing metal contacts (e.g., p-contacts and n-contacts). The additional processing may also include etching the semiconductor structure 1200 to form one or more LED mesas, where each LED mesa has an active region that includes a matrix of QW cells. In some embodiments, the semiconductor structure 1200 may include a sufficient number of QW cells 1234 to permit a two-dimensional array with a thousand or more LED mesas in each dimension (e.g., 1,500 mesas by 1,000 mesas or 2,000 mesas by 1,500 mesas) to be formed concurrently.

In the example of FIG. 12, the quantum wells are formed as part of creating the grooved template 1230 rather than being epitaxially grown onto a template that has been pre-patterned to include grooves or ridges. One advantage to forming the quantum wells in this manner is that the geometry of the QW cells can potentially be formed more precisely, e.g., using an etch mask. However, it may be beneficial to have epitaxially grown QWs, since epitaxially grown QWs tend to have fewer surface defects compared to etched QWs (especially dry etched QWs), and therefore fewer opportunities for non-radiative recombination that would otherwise lead to reduced quantum efficiency. Accordingly, alternative template structures including some of those shown in FIG. 8 (e.g., substrate 802 alone or in combination with doped semiconductor 804) may be better suited for some applications. However, to remove at least some of the etch-induced defects, ex-situ chemical wet-etch cleaning and/or in-situ thermo-chemical cleaning (e.g., thermo-chemical cleaning using one or more gas sources in an epitaxial reactor) can be performed on a patterned template prior to forming a QB layer over any etched quantum wells, similar to the cleaning discussed above with respect to FIG. 10.

Figure 13:
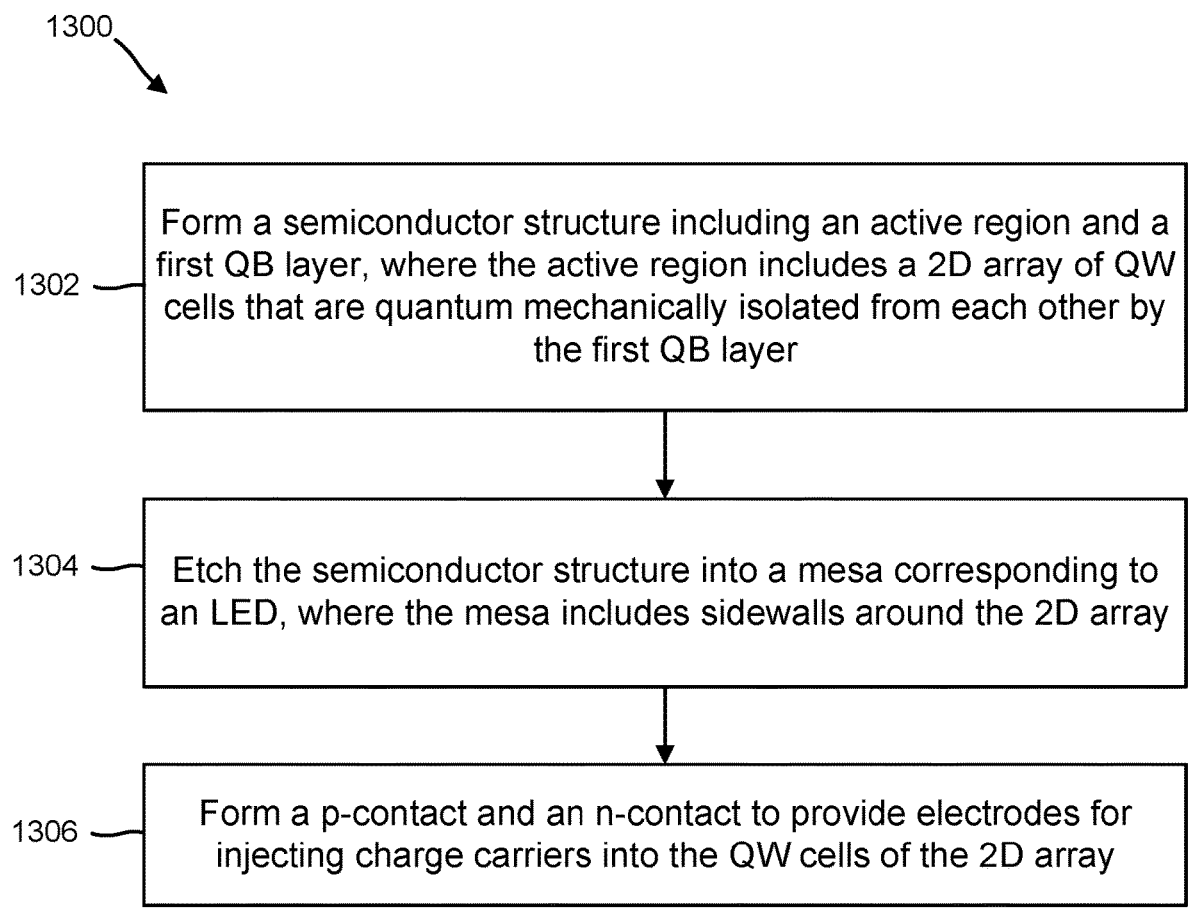
FIG. 13 is a flowchart illustrating a method for forming an LED device, according to some embodiments.

FIG. 13 is a flowchart of a method 1300 for forming an LED device, according to some embodiments. FIG. 13 is provided merely to illustrate certain steps that can be performed as part of forming an LED device. Additional processing may also be performed as part of the method 1300 including, for example, forming optical elements (e.g., lenses) on a light exit surface of the LED device, forming a reflective layer over the side walls of the mesas in the LED device, bonding p-contacts and n-contacts to corresponding contacts on a substrate containing one or more driver circuits configured to generate electrical signals that control the LEDs of the LED device, and the like.

The method 1300 begins at 1302 with the formation of a semiconductor structure including an active region and a first QB layer. The active region includes a two-dimensional (2D) array of QW cells. In the context of the method 1300, the first QB layer is not necessarily the first quantum barrier to be formed on the semiconductor structure. Rather, the first QB layer is a quantum barrier that quantum mechanically isolates the QW cells in the 2D array. For example, the first QB layer may correspond to the QB layer 354 in FIG. 3, which can be formed after the QB layer 352 (e.g., as the final quantum barrier). Alternatively, the first QB layer in the method 1300 may correspond to the QB layer 312, in which case the first QB layer could in fact be the first quantum barrier to be formed. In either case, the first QB layer may include ridge-shaped structures (e.g., nanostructures) that project into the areas between the QW cells of the 2D array.

The ridge-shaped structures of the first QB layer may correspond to the locations of ridges or grooves on a patterned template. For example, in some embodiments, the ridge-shaped structures of the first QB layer may be formed through etching the quantum barrier 808 as part of creating the ridged template 820 in FIG. 8. As another example, the ridged-shaped structures may be formed as a result of epitaxially growing a layer of quantum barrier material over the ridged template 820 or the grooved template 830. Similarly, the peripheral regions of the QW cells in the 2D array may also correspond to the locations of the ridges or grooves on the patterned template and may be formed as part of creating the patterned template (as in the example of FIG. 12) or epitaxially grown over the patterned template (as in the example of FIG. 9). Accordingly, the order in which the 2D array and the first QB layer are formed relative to each other can vary depending on implementation.

At 1304, the semiconductor structure is etched into a mesa corresponding to an LED (e.g., the mesa 102 in FIG. 1). The mesa includes sidewalls around the 2D array and, therefore, encompasses multiple QW cells. In some embodiments, the etching in 1304 may involve forming multiple LED mesas, e.g., by subdividing the 2D array formed in 1302 into smaller arrays. In this manner, an LED array can be formed through the same etching step, and such that each LED in the LED array includes its own matrix of QW cells.

At 1306, a p-contact and an n-contact are formed, e.g., through metal deposition, to provide electrodes for the LED(s) that correspond to each mesa formed in 1304. In some embodiments, each mesa may be provided with its own p-contact and n-contact, which operate as electrodes for injecting charge carriers into the QW cells within the mesa. Alternatively, two or more LED mesas may share a common p-contact and/or n-contact, in which case a pair of contacts may be operated to concurrently inject carriers into QW cells of the two or more LED mesas.

Figure 14:
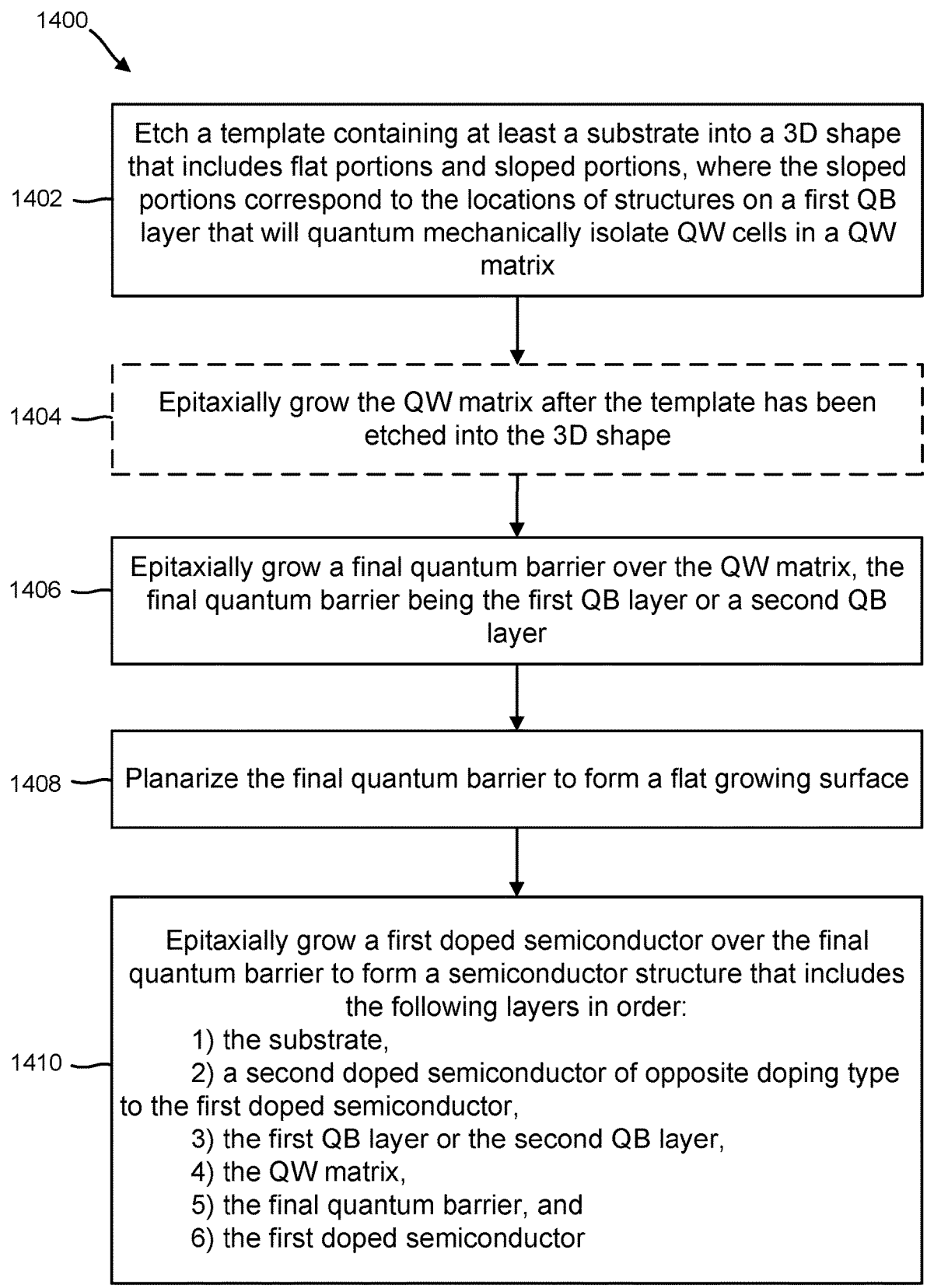
FIG. 14 is a flowchart illustrating a method for creating a semiconductor structure usable for forming an LED device, according to some embodiments.

FIG. 14 is a flowchart of a method 1400 for creating a semiconductor structure usable for forming an LED device, according to some embodiments. The method 1400 may be performed to implement the functionality in block 1302 of FIG. 13. The method 1400 begins at 1402 with etching a template into a 3D shape that includes flat portions and sloped portions. The template contains at least a substrate. Examples of templates were described earlier in reference to FIG. 8. Other template configurations are also possible.

The etching performed in 1402 patterns the template to define regions corresponding to the locations of QW cells in a matrix of QW cells (e.g., a 2D array such as shown in FIG. 3). As indicated above, although the cells in the QW matrix may be laid out along one or more dimensions to form an array, the QW cells are 3D components characterized by one or more layers of quantum well material. The flat portions of the etched template correspond to the central regions of the QW cells. The sloped portions of the etched template correspond to areas between QW cells. In particular, the sloped portions correspond to the locations of structures on a first QB layer that will quantum mechanically isolate the QW cells, e.g., the first QB layer in the method of FIG. 13. Thus, the 3D shape of the etched template may define the boundaries of each cell in the QW matrix.

At 1404, the QW matrix may optionally be epitaxially grown after the template has been etched into the 3D shape. For example, if the template includes a doped semiconductor layer, the QW matrix can be grown on top of the doped semiconductor layer. Similarly, if the template is a bare substrate, the doped semiconductor layer (e.g., an n-region) may be grown before growing the QW matrix. As discussed above, the sloped portions of the template are regions where less material is grown. Accordingly, growth of the QW cells is constrained to being primarily within the locations of the flat portions of the template. The growth of the QW matrix is optional because, as indicated in the example of FIG. 12, the QW matrix may be formed as part of etching a template that includes existing quantum wells. Thus, the QW matrix may, in some embodiments, be formed in 1402. Similarly, the first QB layer may be epitaxially grown on the etched template or formed as part of the etching in 1402.

At 1406 a final quantum barrier is epitaxially grown over the QW matrix. The final quantum barrier is the last-formed QB layer and may correspond to the first QB layer that operates to quantum mechanically isolate the QW cells. Alternatively, the final quantum barrier may correspond to a second QB layer that is located opposite to the first QB layer and that acts as a quantum barrier between the QW cells and a doped semiconductor layer (e.g., a p-region). As apparent from the discussion of FIG. 5, the second QB layer (e.g., the QB layer 314) does not prevent carriers (e.g., holes) from being injected into the QW cells. Unlike the first QB layer, the second QB layer does not necessarily include structures that laterally separate the QW cells. The second QB layer does not need to include such structures because, as discussed above, the peripheral regions of the QW cells that are adjacent to the second QB layer can be formed in such a way that carriers exhibit a quantum mechanical preference for the central regions of the QW cells, e.g., due to the peripheral regions having a wider bandgap and/or thinner quantum wells relative to the central regions. Similarly, charge carriers (e.g., electrons) may be injected into QW cells through the first QB layer. However, migration of carriers (e.g., lateral diffusion) may be prevented or reduced by virtue of the structures of the first QB layer being interposed between adjacent QW cells.

At 1408, the final quantum barrier is planarized to form a flat surface for growing one or more additional layers, e.g., one or more p-doped layers.

At 1410, a first doped semiconductor (e.g., the one or more p-doped layers) is epitaxially grown over the final quantum barrier. Upon formation of this first doped semiconductor, the resulting semiconductor structure may include the following layers in order: the substrate, a second doped semiconductor of opposite doping type to the first doped semiconductor (e.g., one or more n-doped layers), the first QB layer or the second QB layer, the QW matrix, the final quantum barrier, and the first doped semiconductor.

FIGS. 15A-15C illustrate an example of a process for forming an LED device 1500 according to certain embodiments. In FIG. 15A, multiple LED arrays 1535 are formed on a wafer comprising a semiconductor structure 1530, a bonding layer 1525, and a carrier substrate 1520. The semiconductor structure 1530 includes a plurality of semiconductor layers (not shown) and may, for example, correspond to the semiconductor formed as a result of the processing in block 1410 of FIG. 14. In some embodiments, the substrate on which the semiconductor structure 1530 is formed (e.g., substrate 1202 in FIG. 12) may be removed prior to adding the bonding layer 1525 and the carrier substrate 1520. The bonding layer 1525 may serve to temporarily attach the LED arrays 1535 to the carrier substrate 1520, with the carrier substrate 1520 holding the LED arrays 1535 in alignment so that the LED arrays 1535 can be bonded to a driver wafer 1545.

Each LED array 1535 may include a plurality of LEDs 1510. As shown in FIG. 15B, an LED 1510 in an LED array 1535 may include a QW matrix with multiple QW cells 1502. The area of the LED 1510 corresponding to the QW matrix may be etched to form an LED mesa (not shown) so that each LED array 1535 includes a separate mesa for each LED 1510. The LED 1510 may further include at least one p-contact 1540 and at least one n-contact 1550. The p-contact 1540 and the n-contact 1550 may be shared by the QW cells 1502. For example, the p-contact 1540 may be in ohmic contact with a p-doped region in the semiconductor structure 1530 and may be centered with respect to the QW matrix to overlap at least some of the QW cells 1502. The n-contact 1550 may be located around a perimeter of the LED 1510 and may be in ohmic contact with an n-doped region of the semiconductor structure 1530. The p-contact 1540 and the n-contact 1550 may be metallized contacts and can take various shapes. For example, the contacts 1540, 1550 may be planar contacts or bumped contacts having an interconnect material.

The LED arrays 1535 may be singulated through etching the semiconductor structure 1530, the bonding layer 1525, and the carrier substrate 1520 to separate the LED arrays 1535. As shown in FIG. 15C, the LED arrays 1535 may be bonded to the driver wafer 1545 after being singulated. The driver wafer 1545 may include one or more driver circuits that are embedded in a silicon substrate. The driver wafer 1545 may further include contacts corresponding to the contacts of the LED arrays 1535. The bonding of the LED arrays 1535 may involve inverting the LED arrays 1535 so that the contacts of the LED arrays 1535 (e.g., p-contact 1540 and n-contact 1550) are facing the contacts of the driver wafer 1545, then forming interconnects 1565, e.g., through metal-to-metal bonding of contact pads located on respective bonding surfaces of the driver wafer 1545 and the LED arrays.

The embodiments described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using a light emitting diode (LED) based display subsystem.

In some embodiments, the systems, devices, and/or components (e.g., integrated circuits or integrated circuit packages) described herein may be integrated into an HMD. For example, such an HMD may include one or more light emitters and/or one or more light sensors incorporated into a portion of a frame of the HMD such that light can be emitted toward a tissue of a wearer of the HMD that is proximate to or touching the portion of the frame of the HMD. Example locations of such a portion of a frame of an HMD may include a portion configured to be proximate to an ear of the wearer (e.g., proximate to a superior tragus, proximate to a superior auricular, proximate to a posterior auricular, proximate to an inferior auricular, or the like), proximate to a forehead of the wearer, or the like. It should be noted that multiple sets of light emitters and light sensors may be incorporated into a frame of an HMD such that a photoplethysmogram (PPG) can be determined from measurements associated with multiple body locations of a wearer of the HMD.

In the present description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments may be described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used.

Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto. Thus, although specific embodiments have been described, these are not intended to be limiting. Various modifications and equivalents are within the scope of the following claims.

What is claimed is:

1. A light emitting diode (LED) device comprising:
   a plurality of mesas, each mesa of the plurality of mesas corresponding to a separate LED in the LED device and comprising a layered semiconductor structure that includes:
   an active region including a two-dimensional (2D) array of quantum well (QW) cells, each QW cell including at least one quantum well configured to operate as a light-emitting region; and
   a first quantum barrier (QB) layer that quantum mechanically isolates the QW cells of the 2D array from each other, wherein the first QB layer is continuous across both dimensions of the 2D array.

2. The LED device of claim 1, wherein the LED device further comprises:
   a p-contact; and
   an n-contact, wherein the p-contact and the n-contact are shared by the QW cells in a first mesa of the plurality of mesas such that application of a voltage across the p-contact and the n-contact causes charge carriers to be injected into the QW cells in the first mesa concurrently.

3. The LED device of claim 1, wherein the first QB layer comprises ridge-shaped nanostructures that separate adjacent QW cells in the 2D array.

4. The LED device of claim 3, wherein:
   the 2D array is epitaxially grown over the first QB layer; or
   the first QB layer is epitaxially grown over the 2D array.

5. The LED device of claim 3, wherein the nanostructures enclose a perimeter of each QW cell in the 2D array.

6. The LED device of claim 3, wherein:
   each QW cell comprises a central region and a peripheral region,
   the peripheral region is adjacent to a nanostructure of the first QB layer, and
   the peripheral region is thinner than the central region.

7. The LED device of claim 6, wherein a bandgap of the at least one quantum well is wider along the peripheral region than along the central region.

8. The LED device of claim 3, wherein each mesa further comprises a doped semiconductor layer formed on a surface of the first QB layer, the surface of the first QB layer being a substantially planar surface opposite to the active region.

9. The LED device of claim 8, wherein the first QB layer comprises a material having a bandgap different from a bandgap of the doped semiconductor layer, and wherein the bandgap of the first QB layer is wider than a bandgap of the at least one quantum well.

10. The LED device of claim 1, wherein each mesa further comprises a second QB layer formed on a surface of the active region opposite the first QB layer.

11. The LED device of claim 1, wherein each QW cell comprises:
    a first QW layer;
    a second QW layer; and
    a local QB layer between the first QW layer and the second QW layer.

12. The LED device of claim 11, wherein the first QB layer is thicker than the local QB layer.

* * * * *